(12) United States Patent
Cram et al.

(10) Patent No.: US 7,439,752 B2
(45) Date of Patent: Oct. 21, 2008

(54) METHODS OF PROVIDING SEMICONDUCTOR COMPONENTS WITHIN SOCKETS

(75) Inventors: Daniel P. Cram, Boise, ID (US); A. Jay Stutzman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/418,724

(22) Filed: May 3, 2006

(65) Prior Publication Data

US 2007/0257688 A1 Nov. 8, 2007

(51) Int. Cl.
G01R 31/02 (2006.01)
(52) U.S. Cl. .................................... 324/758
(58) Field of Classification Search ............. 324/158.1, 324/754–765
See application file for complete search history.

(56) References Cited

U.S. PATENT DOCUMENTS

| | | | |
|---|---|---|---|
| 5,796,264 A * | 8/1998 | Farnworth et al. ........... 324/758 |
| 6,048,744 A | 4/2000 | Corisis et al. |
| 6,246,108 B1 | 6/2001 | Corisis et al. |
| 6,285,202 B1 * | 9/2001 | Hembree ..................... 324/755 |
| 6,396,292 B2 * | 5/2002 | Hembree et al. ............ 324/755 |
| 6,441,628 B1 * | 8/2002 | Farnworth et al. ........... 324/755 |
| 6,462,568 B1 | 10/2002 | Cram |
| 6,483,329 B1 | 11/2002 | Cram |
| 6,489,794 B1 | 12/2002 | Cram |
| 6,727,715 B2 | 4/2004 | Cram |
| 6,756,802 B2 | 6/2004 | Cram |
| 6,836,003 B2 | 12/2004 | Corisis et al. |
| 6,856,151 B1 | 2/2005 | Cram |
| 6,858,453 B1 | 2/2005 | Corisis et al. |
| 6,888,364 B2 | 5/2005 | Cram |
| 6,998,862 B2 | 2/2006 | Cram |
| 7,108,517 B2 * | 9/2006 | Harper ..................... 439/71 |
| 2003/0034280 A1 * | 2/2003 | Jung ....................... 209/573 |
| 2004/0112142 A1 * | 6/2004 | Min et al. .................. 73/818 |
| 2004/0212382 A1 * | 10/2004 | Cram ...................... 324/755 |
| 2005/0134299 A1 | 6/2005 | Cram |
| 2005/0253602 A1 | 11/2005 | Cram et al. |
| 2006/0012389 A1 * | 1/2006 | Cram ...................... 324/755 |

* cited by examiner

Primary Examiner—Vinh P. Nguyen
Assistant Examiner—Joshua Benitez
(74) Attorney, Agent, or Firm—Wells St. John P.S.

(57) ABSTRACT

The invention includes methods of utilizing removable mechanical precising mechanisms and/or optical-based precising mechanisms to align chips within sockets. The sockets can be configured so that compression of the sockets opens a clamping mechanism. A chip can be placed within a socket with a manipulator and aligned during compression of the socket. Subsequently, the compression of the socket can be released while the manipulator remains in contact with the chip to hold the chip in place until the clamping mechanism is retaining the chip in the socket. The chip can then be released from the manipulator. The invention also includes systems for utilizing removable nests to align various chip geometries within generic socket designs.

9 Claims, 20 Drawing Sheets

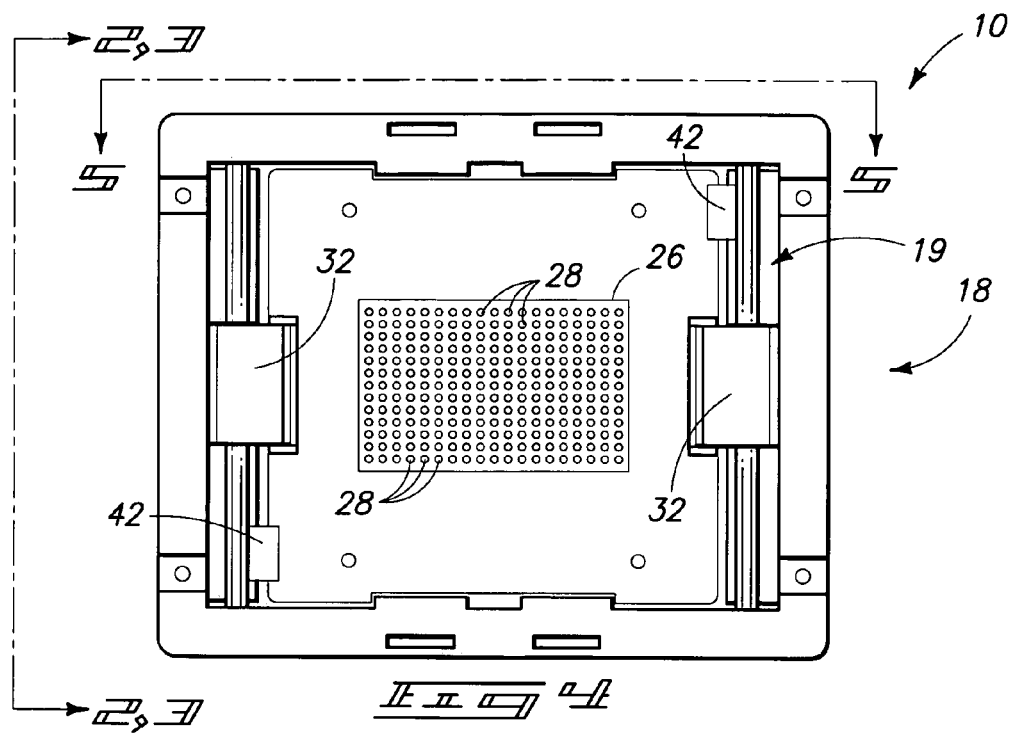
Fig. 4
PRIOR ART
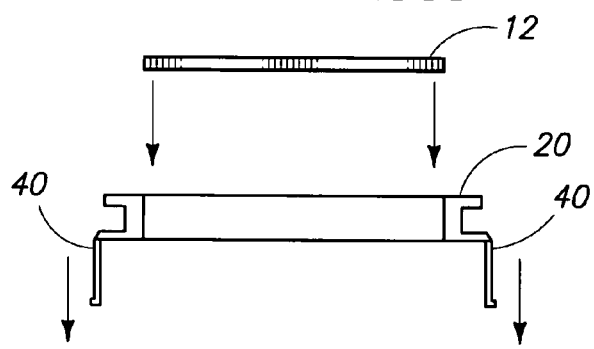
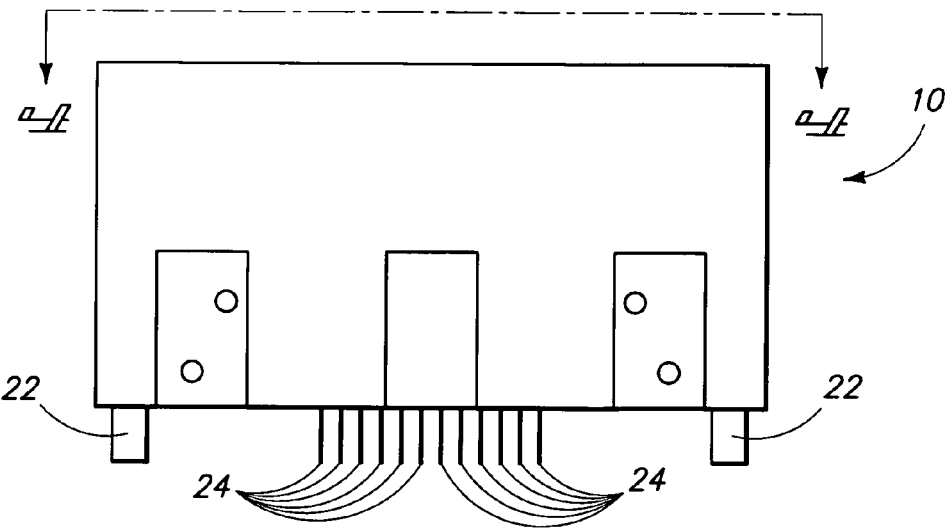
Fig. 5
PRIOR ART

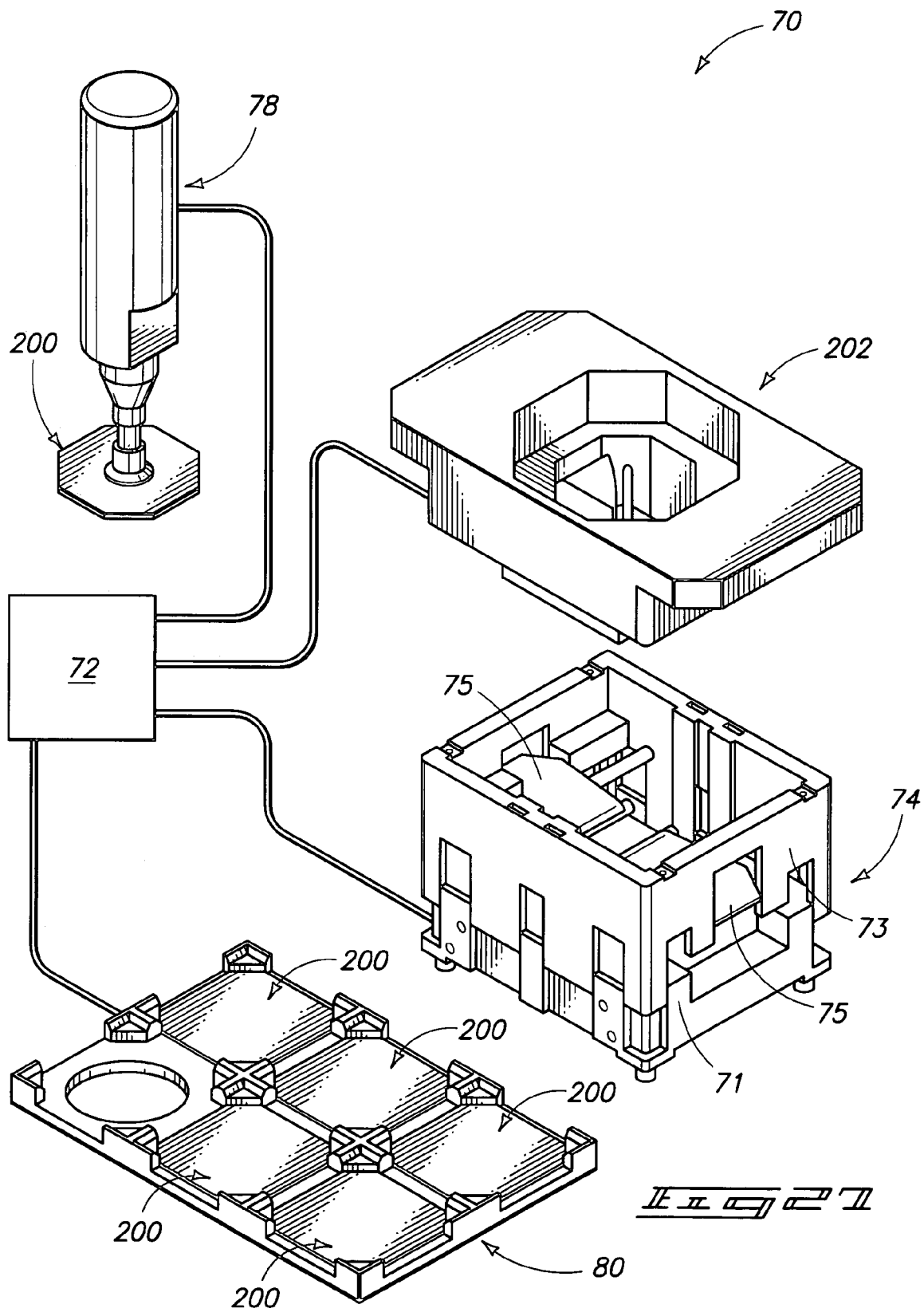

METHODS OF PROVIDING SEMICONDUCTOR COMPONENTS WITHIN SOCKETS

TECHNICAL FIELD

The invention pertains to systems configured for utilizing two or more of multiple different semiconductor component configurations, to methods of providing semiconductor components within sockets, and to methods of retaining semiconductor component configurations within sockets.

BACKGROUND OF THE INVENTION

Semiconductor components, such as dice and packages, are frequently provided in sockets for incorporation into electrical systems, and/or for testing. For instance, the sockets can be configured to be attached to circuit boards so that circuitry associated with the semiconductor components can be electrically connected through the sockets to circuitry associated with the boards.

Exemplary prior art sockets are described with reference to FIGS. 1-12; with FIGS. 1-8 illustrating one type of socket, and FIGS. 9-12 illustrating another type of socket.

Referring to FIGS. 1-4, a prior art socket 10 is illustrated. The socket is shown in FIGS. 1 and 2 with a retaining mechanism in a retaining position (discussed below); and in FIGS. 3 and 4 with the retaining mechanism in a non-retaining position (also discussed below).

The socket 10 includes a base 16 (FIGS. 2 and 3), and a movable lid 18 joined to the base. The base 16 includes mounting pins 22 configured for mounting the socket to a board or other suitable substrate having mating openings configured for engaging the mounting pins 22. Base 16 further includes pin contacts 24 configured to engage mating contacts on the board or other substrate to which the socket is to be mounted, and to provide electrical coupling between a semiconductor component retained in the socket with other circuitry external of the socket. Base 16 also includes a contact plate 26 having a plurality of openings 28 (only some of which are labeled) extending therethrough. The openings are configured to align with terminal contacts of a semiconductor component retained in the socket, and electrical interconnects (not shown) are provided in the base to extend through the openings and electrically couple the terminal contacts of the semiconductor component with the contacts 24 of the socket.

Lid 18 has an opening 19 therein within which a semiconductor component is placed to ultimately rest on the contact plate 26 of the base.

Lid 18 is movably mounted to base 16 and operates a retention mechanism containing a pair of clamps 32 configured to retain a semiconductor component in contact plate 26. The clamps ultimately compress a semiconductor component against plate 26. The retention mechanism has a retaining position (FIGS. 1 and 2) and a non-retaining position (FIGS. 3 and 4). The retaining position retains a semiconductor component against plate 26, and the non-retaining position exposes the plate so that a semiconductor component can be placed against the plate. The non-retaining position can be considered a loading position, in that such position enables a semiconductor component to be loaded into the socket; and the retaining position can be considered a latched position.

Springs 34 (FIG. 2) bias the lid 18 and the clamps 32 of the retention mechanism to the latched position of FIGS. 1 and 2. Compression of lid 18 toward base 16 retracts the clamps 32 into the loading position of FIGS. 3 and 4.

Movement of lid 18 relative to base 16 thus shifts the retaining mechanism between a retaining position and a non-retaining position. The movement of lid 18 relative to base 16 is illustrated in FIGS. 2 and 3 by axes 35. Although not shown, the movement of lid 18 relative to base 16 can also shift the location of contact plate 26 so that electrical interconnects (not shown) beneath the plate extend upwardly through the openings 28 to contact terminal contacts of a semiconductor component when the clamps 32 are in the latched position.

The sockets of FIGS. 1-4 are standard sockets which have not been modified to retain particular semiconductor components. The sockets can be modified by attaching nests within openings 19 to provide lateral alignment for semiconductor components placed within the openings. FIG. 5 shows a side view of the socket 10 of FIG. 4 at the loading position of FIG. 4, and together with a nest 20 and semiconductor component 12 which are to be provided within the opening 19 of the lid. The nest 20 comprises a pair of retaining prongs 40 configured to extend within mating openings 42 (shown in FIG. 4) of socket 10 so that the nest can be clipped into the socket. The semiconductor component comprises a plurality of terminal contacts (not shown), which can, for example, protrude from the package as solder bumps or balls (and thus can be a Ball Grid Array, BGA), or can be non-protruding (typically planar) conductive surfaces (and thus can be, for example, a Land Grid Array, LGA; Leadless Chip Carrier, LCC; Quad Flat-Pack No-Lead Package, QFN; Micro Lead Frame, MLF; etc.).

FIG. 6 shows a top view of the nest 20, and also shows a top view of the semiconductor component 12 which will be aligned with the nest. The nest has an outer peripheral outline 21 matching an outline of the hollow interior region 19 of the socket lid, and has an inner peripheral outline 23 matching an outer peripheral outline 13 of semiconductor component 12. The inner peripheral outline 23 has a sloped alignment surface 25 for aligning component 12 as it is inserted into the nest.

FIG. 7 shows socket 10 after the nest 20 is inserted into opening 19 and clipped into place; and shows clamps 32 in the loading position.

FIG. 8 shows socket 10 after semiconductor component 12 is inserted within nest 20, and after clamps 32 have been shifted into the retaining position.

The socket 10 of FIGS. 1-8 is one example of a prior art socket. Such utilizes a retention mechanism which clamps a semiconductor component against the bottom (base) portion of the socket. FIGS. 9-12 illustrate another prior art socket 50 which utilizes a different type of retention mechanism. The socket 50 is configured to be utilized with semiconductor components having terminal contacts which extend outwardly from the components. An example of such semiconductor component is shown in FIG. 9 as a component 52, with the illustrated component having terminal contacts 54 extending outwardly from a shown bottom surface of the component. The terminal contacts can, for example, correspond to solder balls of a BGA.

Socket 50 comprises a base 56 and movable lid 58, similar to the base and movable in of the above-described socket 10. The base comprises a contact plate 62 having a plurality of openings 64 (only some which are labeled) extending therethrough.

Lid 58 is compressibly mounted to the base through springs 60. In operation, compression of the lid opens a retaining mechanism comprising clamps configured to grasp the projecting terminal contacts 54. The clamps are beneath or within the openings 64 as described in more detail with reference to FIGS. 11 and 12. Specifically, FIG. 11 shows an expanded view of a portion of plate 62 containing several of the openings 64. The openings have clamps 66 therein. In the view of FIG. 11, the clamps are in an open, or non-retaining, position. FIG. 12 shows the expanded region of FIG. 11 with the clamps 66 in a closed, or retaining, position.

Socket 50 illustrates an alternative type of retaining mechanism to that of the socket 10 of FIGS. 1-8. The prior art also includes sockets which utilize combinations of retention mechanisms analogous to that of FIGS. 1-8 with mechanisms analogous to that of FIGS. 9-12.

Nests similar to the nests discussed above with reference to FIGS. 1-8 can be utilized with sockets 50 for aligning components 52 within the sockets. Accordingly, the prior art nests can be utilized with any of numerous different socket designs.

BRIEF DESCRIPTION OF THE DRAWINGS

FIG. 4 is a top view of the prior art socket of FIG. 1, with the retention mechanism being in the non-retaining position.

FIG. 5 is a side view of the prior art socket of FIG. 4, together with a prior art nest and semiconductor component which ultimately form an assembly with the socket.

FIG. 27 illustrates the socket of FIG. 13 with a different assembly from that of FIGS. 13-22, and at a processing stage analogous to that of FIG. 15.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

As used herein, the term "semiconductor component" refers to an electronic element that includes a semiconductor die. Exemplary semiconductor components include semiconductor packages, semiconductor dice, BGA devices, LGA devices, LCC devices, QFN devices, MLF devices, and direct digital control (DDC) devices.

Semiconductor components can have any of numerous geometrical configurations. Such geometrical differences can be differences in size (footprint), or differences in geometrical shape. For instance, as the industry advances, semiconductor manufacturers are developing new components having smaller peripheral outlines (footprints), and denser configurations of terminal contacts. As a specific example, a second generation component, such as a chip scale package (CSP), typically has a smaller outline than a first generation component, such as a ball grid array (BGA) device.

The differences in geometrical configuration amongst various components can render it difficult to utilize the components within existing sockets. Sockets are generally configured in standard sizes, and accordingly utilization of various geometrically different components within the sockets entails modification of the sockets. Such modification will frequently comprise insertion of nests within the sockets, with the nests being tailored to align particular components. The sockets modified by having the nests incorporated therein are no longer generally suitable for utilization of a large number of different components, but rather have become specifically tailored for utilization with a small subset of components. Thus, a company utilizing a large number of different components, or a person in the field working with a variety of different components, will stock a variety of different modified sockets suitable for utilization with the different components. It would be desired to develop technologies whereby the sockets are not substantially modified so that the standard sockets remain generally applicable for utilization with a variety of different components to avoid problems associated with stocking a variety of modified sockets.

The invention includes aspects in which removable mechanical precising mechanisms (such as removable nests), and/or optical-based precising mechanisms, are utilized to align semiconductor components within sockets so that generic socket configurations can be utilized with various semiconductor configurations. Specific aspects of the invention are described with reference to FIGS. 13-27.

Figure 1:
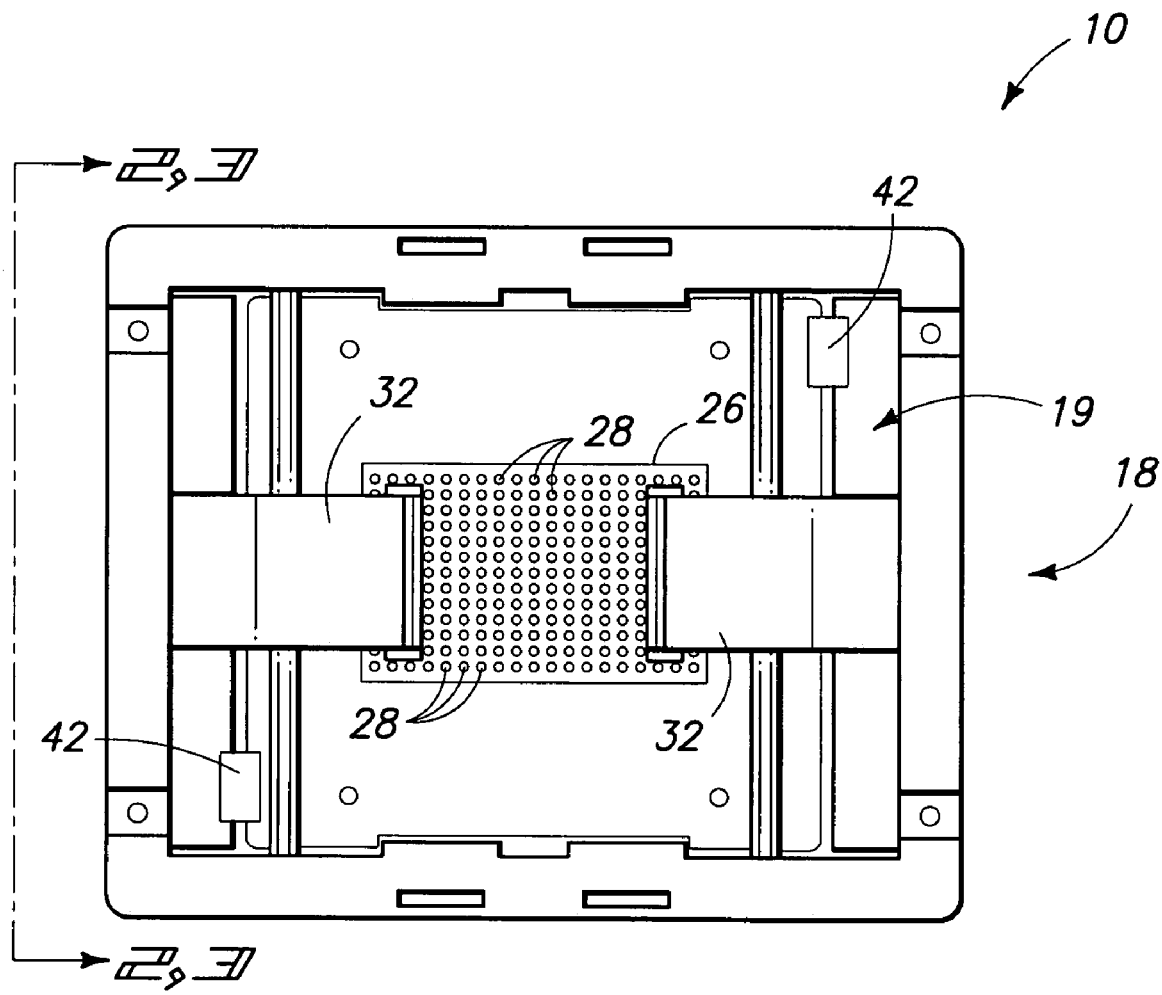
FIG. 1 is a diagrammatic top view of a prior art socket with a retention mechanism in a retaining position.
Figure 2:
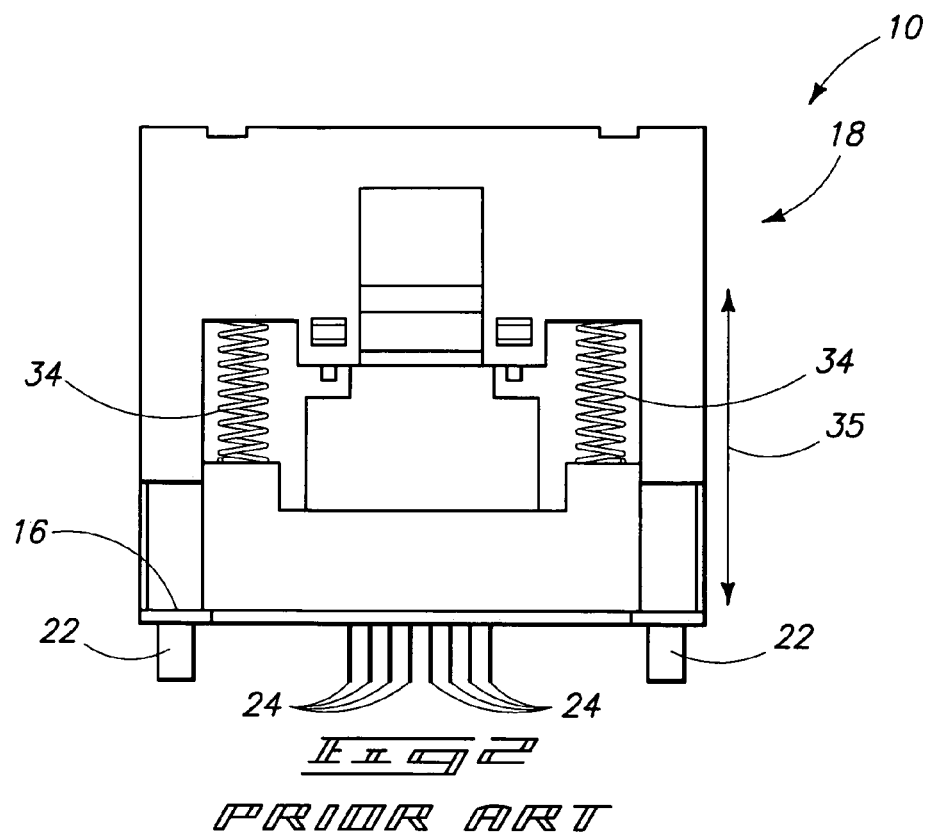
FIG. 2 is a side view of the prior art socket of FIG. 1, with the retention mechanism being in the retaining position.
Figure 3:
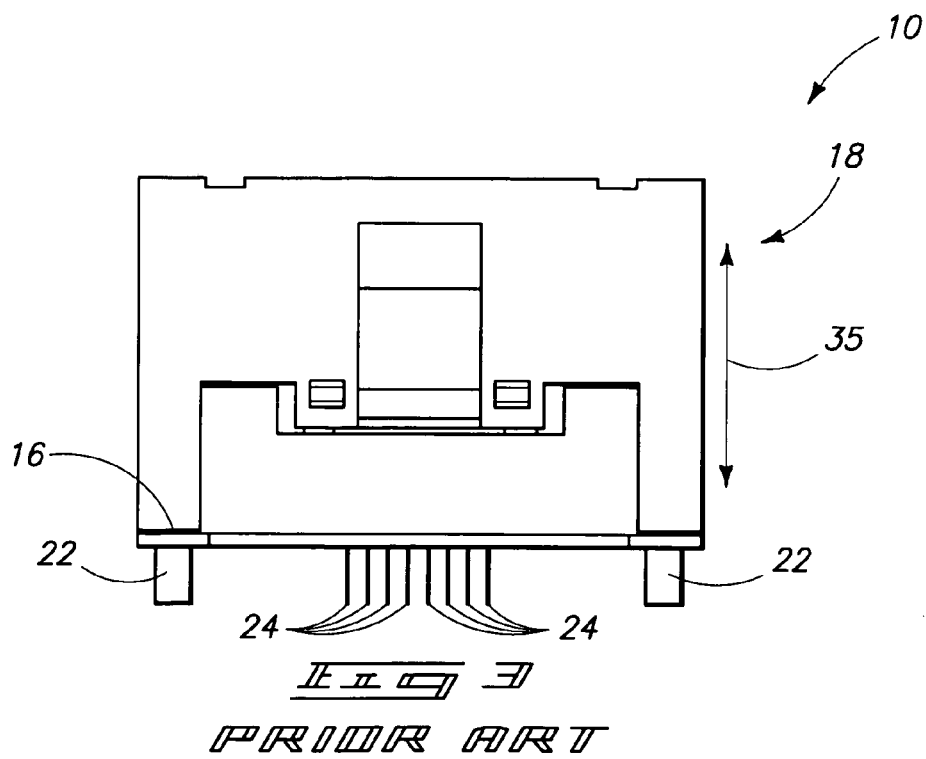
FIG. 3 is a side view of the prior art socket of FIG. 1, with the retention mechanism being in a non-retaining position.
Figure 6:
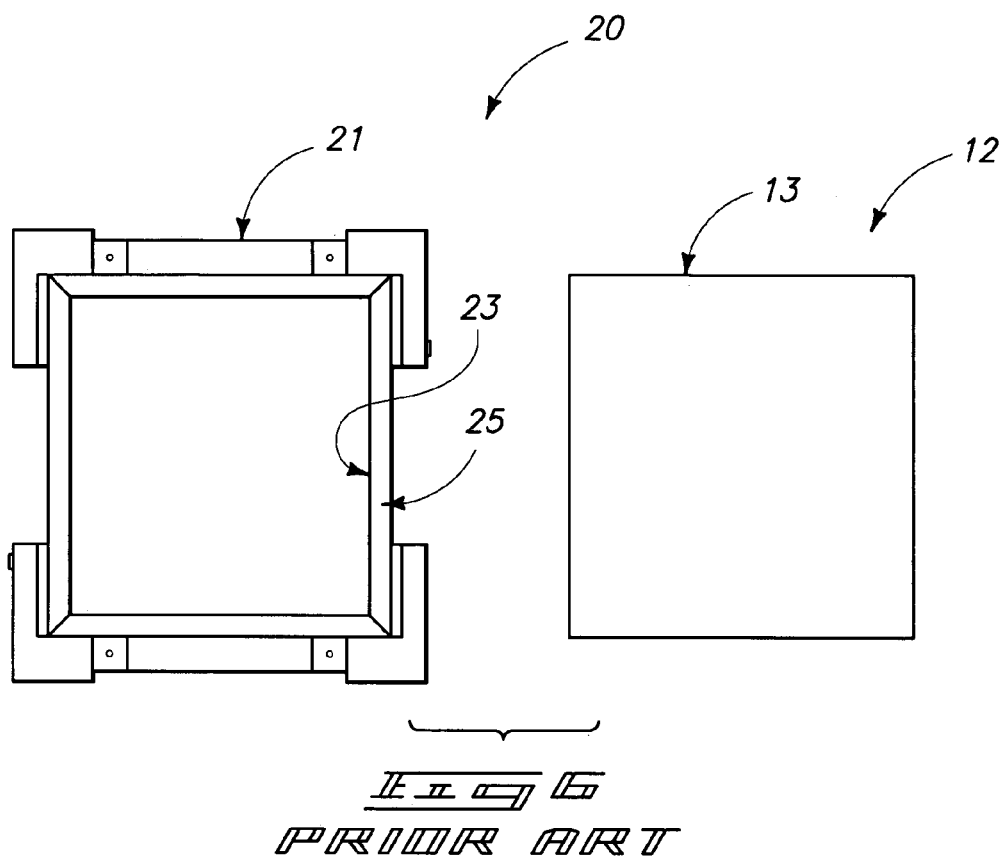
FIG. 6 shows top views of the component and nest of FIG. 5.
Figure 7:
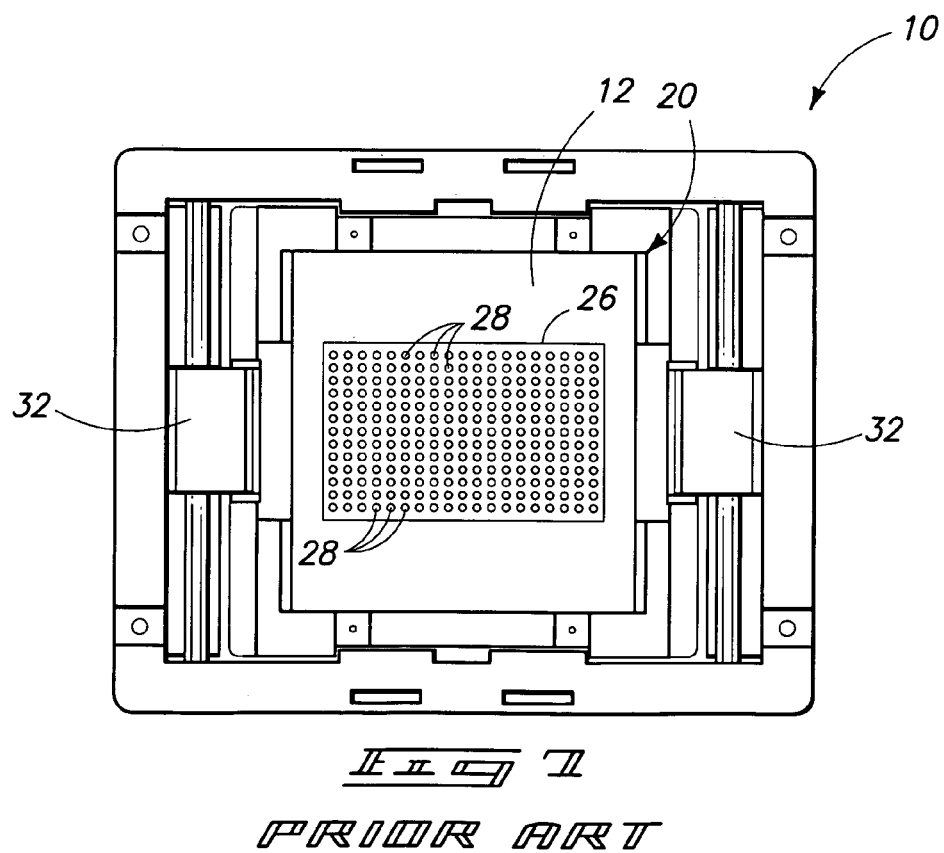
FIG. 7 is a top view of a prior art assembly comprising the nest of FIG. 6 retained within the socket of FIG. 4.
Figure 8:
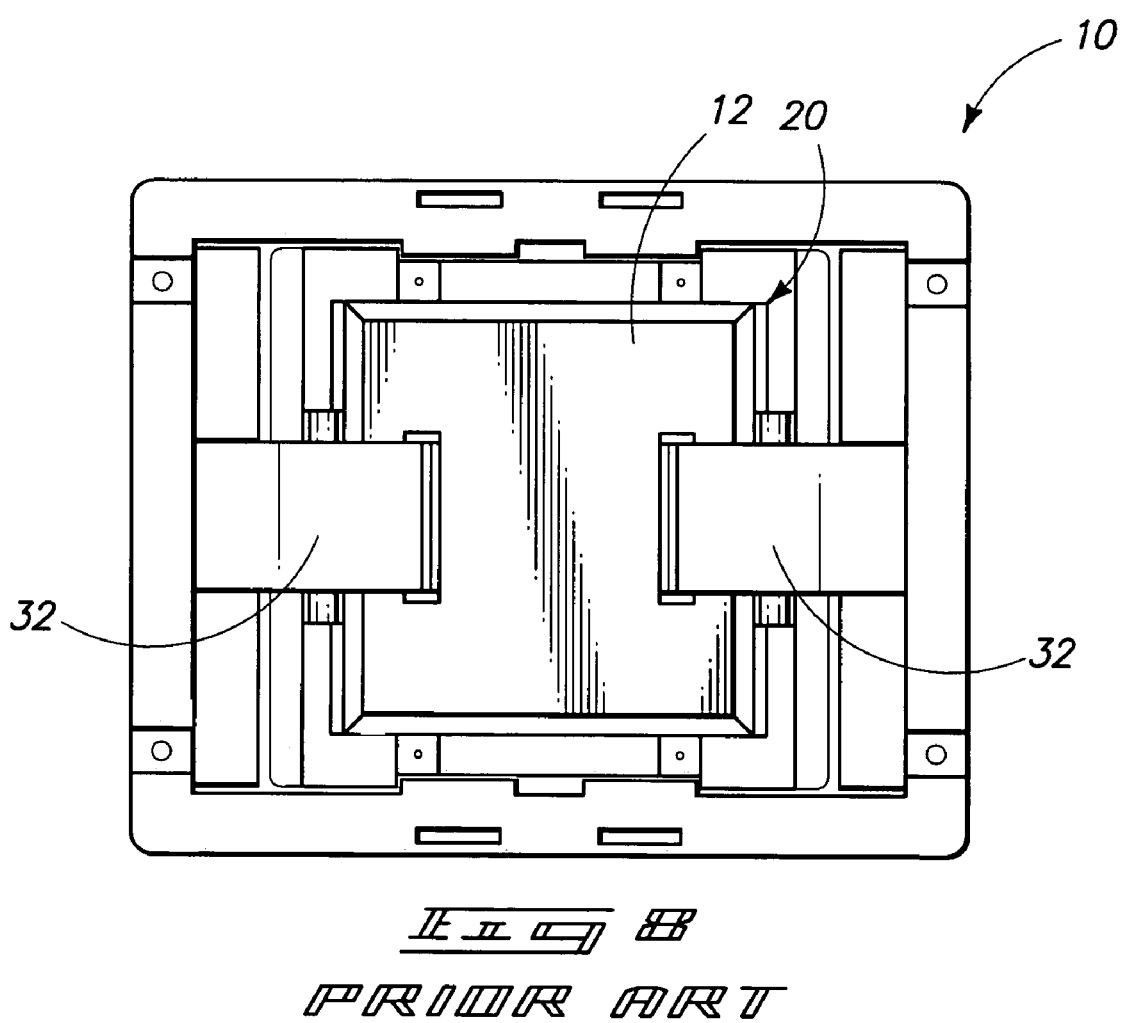
FIG. 8 is a top view of the prior art assembly of FIG. 7 after the semiconductor component of FIG. 6 is inserted within the nest, and the retention mechanism is shifted to the retaining position.
Figure 9:
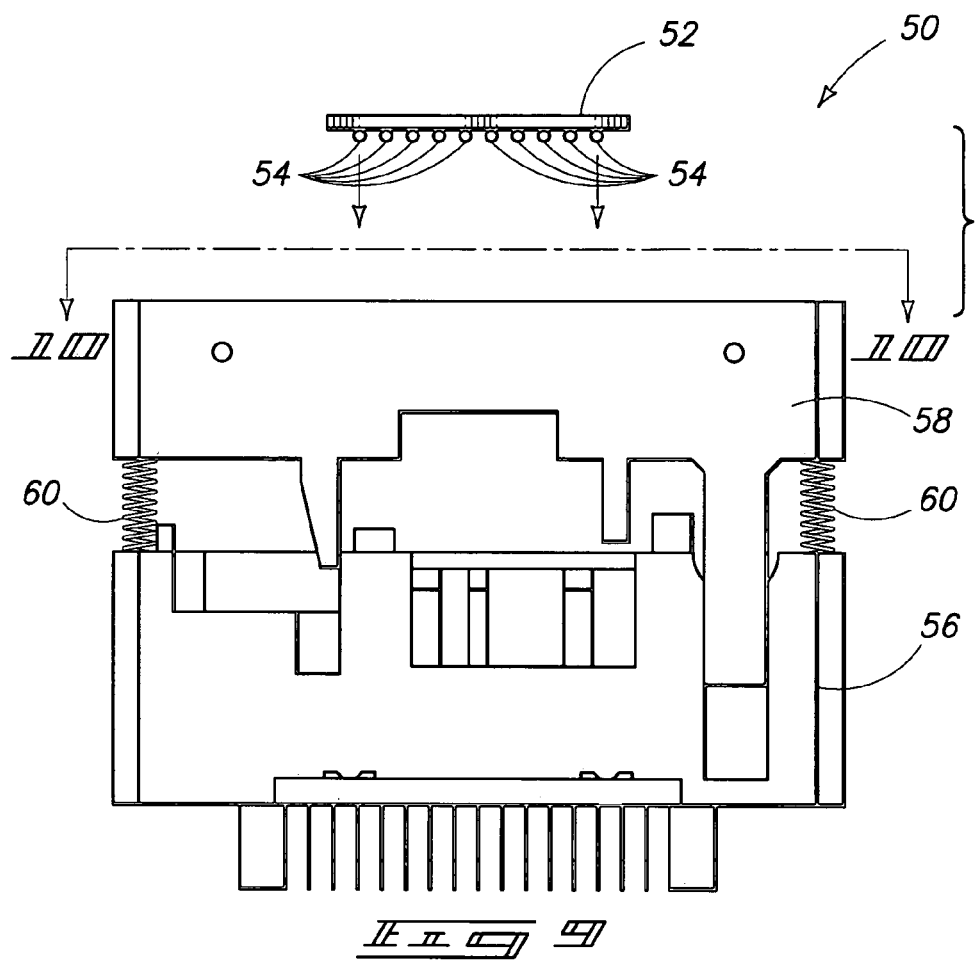
FIG. 9 is a side view of a socket in accordance with another aspect of the prior art, together with a side view of a component suitable for being retained within the socket.
Figure 10:
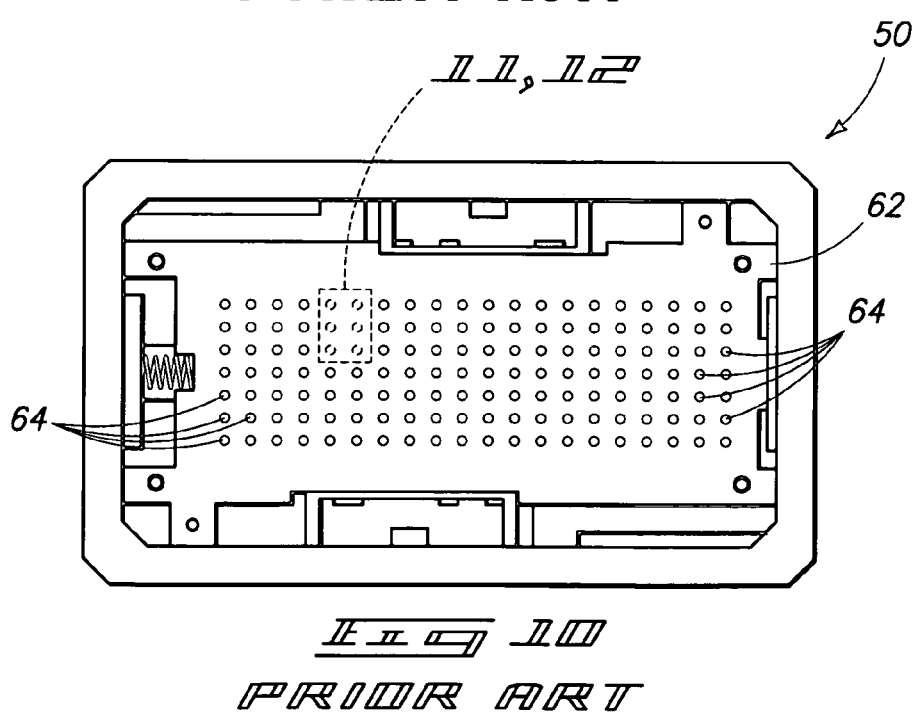
FIG. 10 is a top view of the prior art socket of FIG. 9.
Figure 11:
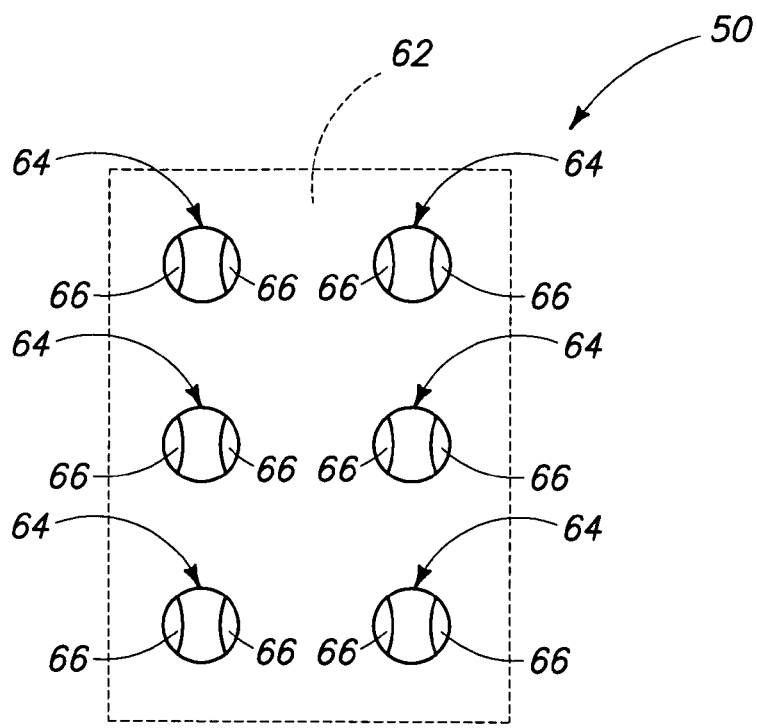
FIG. 11 is an expanded view of a region of the prior art socket of FIG. 10 showing a retention mechanism in a non-retaining position.
Figure 12:
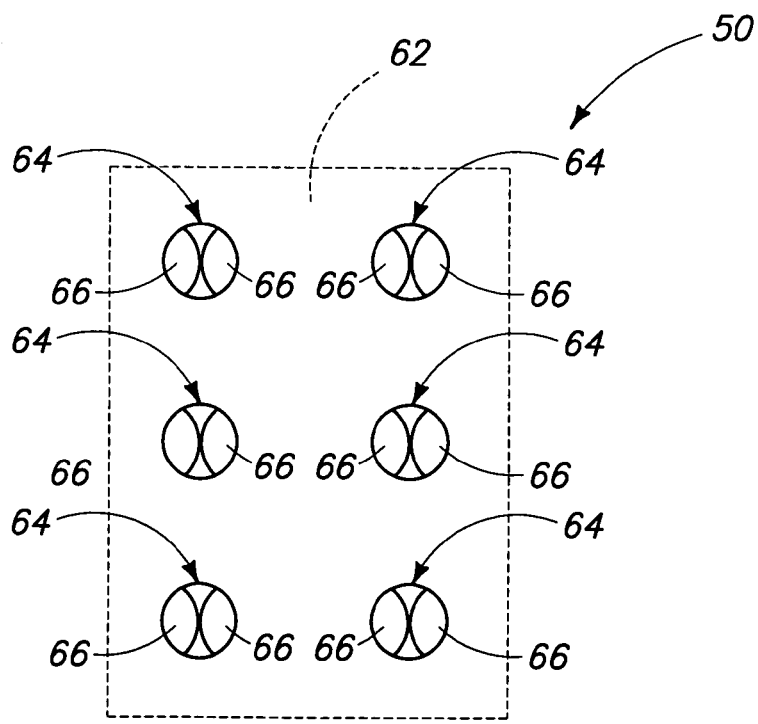
FIG. 12 shows the expanded region of FIG. 11 with the prior art retention mechanism in a retaining position.
Figure 13:
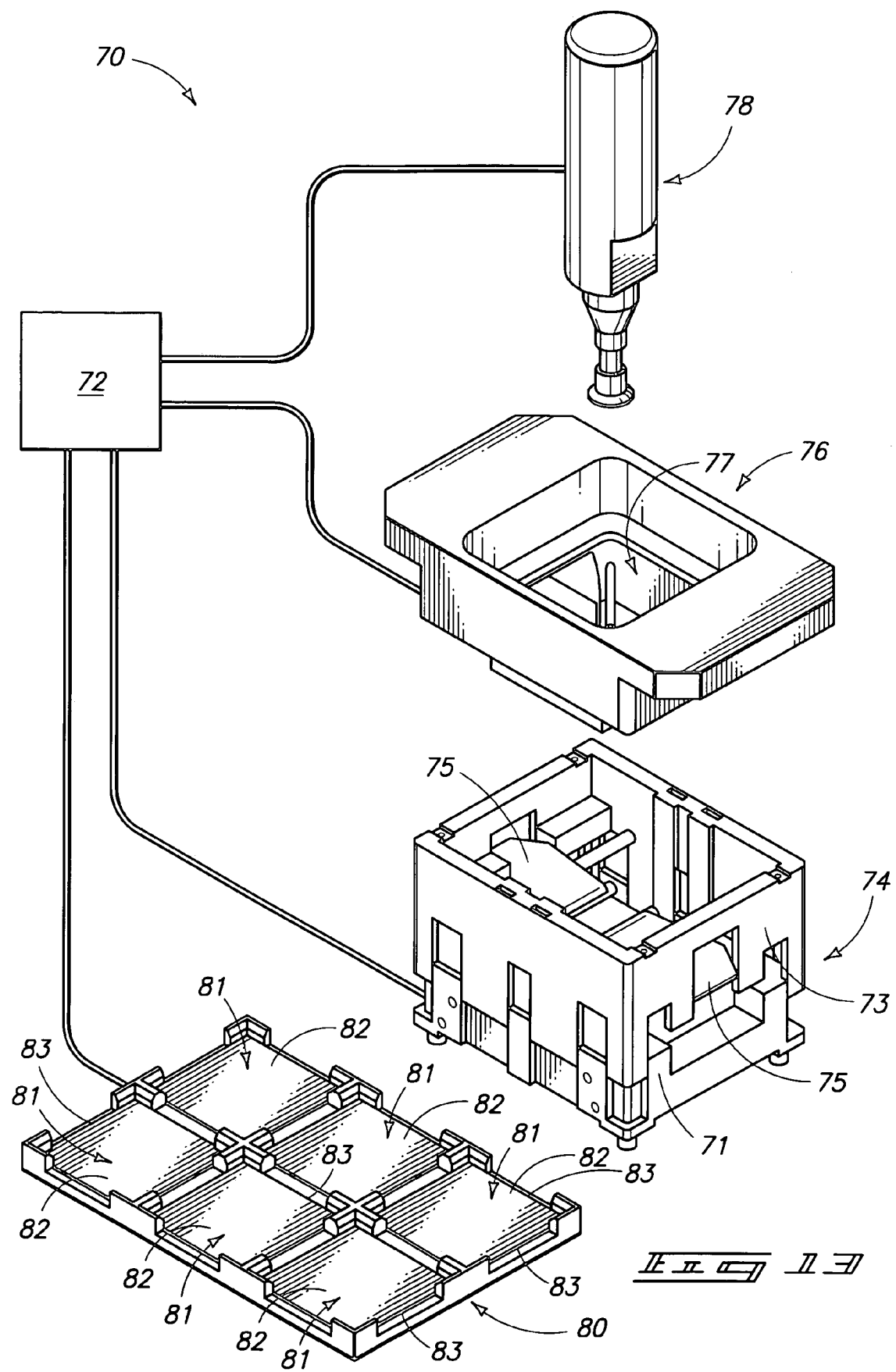
FIG. 13 illustrates a socket and several items of an assembly configured in accordance with an aspect of the present invention for providing a semiconductor component into the socket.

Referring initially to FIG. 13, such diagrammatically illustrates an apparatus 70 comprising a controller 72 linked to a socket 74, a removable nest 76, a manipulator 78, and a tray 80. The tray 80 contains a plurality of semiconductor components 82. The apparatus will be utilized for loading at least one of semiconductor components into the socket, as will become more clear from the discussion that follows.

The manipulator 78 can be any device which can pick a semiconductor component 82 from tray 80 and transfer it to the socket 74. In some aspects, the manipulator can be a vacuum wand.

The socket 74 can be a socket of the types described previously in the "background" section of this disclosure. Accordingly, the socket can have a base 71, a lid 73 on the base, and a retention mechanism containing clamps 75. The retention mechanism 73 on the base, and a retention mechanism containing clamps 75. The retention mechanism is associated with the base and configured to retain semiconductor components within the socket. The lid 73 can be movable relative to the base, with such movement shifting the retention mechanism between a retaining position and a non-retaining position. Although the lid 73 is shown having a configuration similar to the socket lids of the prior art devices discussed in the "background" section of this disclosure, it is to be understood that the lid can have other configurations. For instance, in some aspects (discussed below) the lid is a can have other configurations. For instance, in some aspects (discussed below) the lid is a mechanism of a socket which engages a removable nest to shift a retaining mechanism between a retaining position and a non-retaining position, and the lid has little to do with aligning semiconductor components within the socket. Instead the removable nest, and/or an optical system is utilized for the aligning of the semiconductor components. In such aspects, the lid can be of any configuration suitable to engage at least a portion of the removable nest, and may, for example, be only one or more posts and/or ridges configured to engage the removable nest.

The semiconductor components 82 have exposed upper surfaces 81 which can be engaged by manipulator 78. The semiconductor components will have bottom surfaces (not visible in FIG. 13) in opposing relation to the upper surfaces 81, and such bottom surfaces will have terminal contacts similar to the terminal contacts discussed in the "background" section of this disclosure. Such terminal contacts can, for example, correspond to the non-protruding (typically planar) contacts of an LGA, LCC, QFN, or MLF; or to solder bumps or solder balls of a BGA. The semiconductor components 82 have lateral peripheries comprising sidewall edges 83 (only some of which are labeled).

The nest 76 is configured to fit within the lid 73 of the socket. The nest can be utilized to compress the lid toward the base 71 of the socket, and to thereby shift the retention mechanism into the non-retaining (loading) position. The nest has an inner periphery 77 configured to align a semiconductor component. In the shown aspect, the aligning inner periphery of the nest is configured to surround an entire lateral periphery of a component, but it is to be understood that the nest can also configured such that the aligning inner periphery surrounds only a portion of a semiconductor component.

Nest 76 can be formed of any suitable material, and in typical aspects will be formed of a low-cost, easily moldable or machinable material, such as, for example, plastic or aluminum.

Nest 76 is an example of an alignment tool for aligning a semiconductor component within the lid of a socket, and specifically is an example of a mechanical tool, or mechanical precising system, which can be utilized in some aspects of the present invention: With the term "mechanical precising system" referring to a system which mechanically aligns a semiconductor component within a socket.

Controller 72 can be any apparatus suitable for controlling the orientation of the manipulator 78, removable nest 76, socket 74 and semiconductor component tray 80 relative to one another. In some aspects, controller 72 can be replaced with two or more separate controllers.

Figure 14:
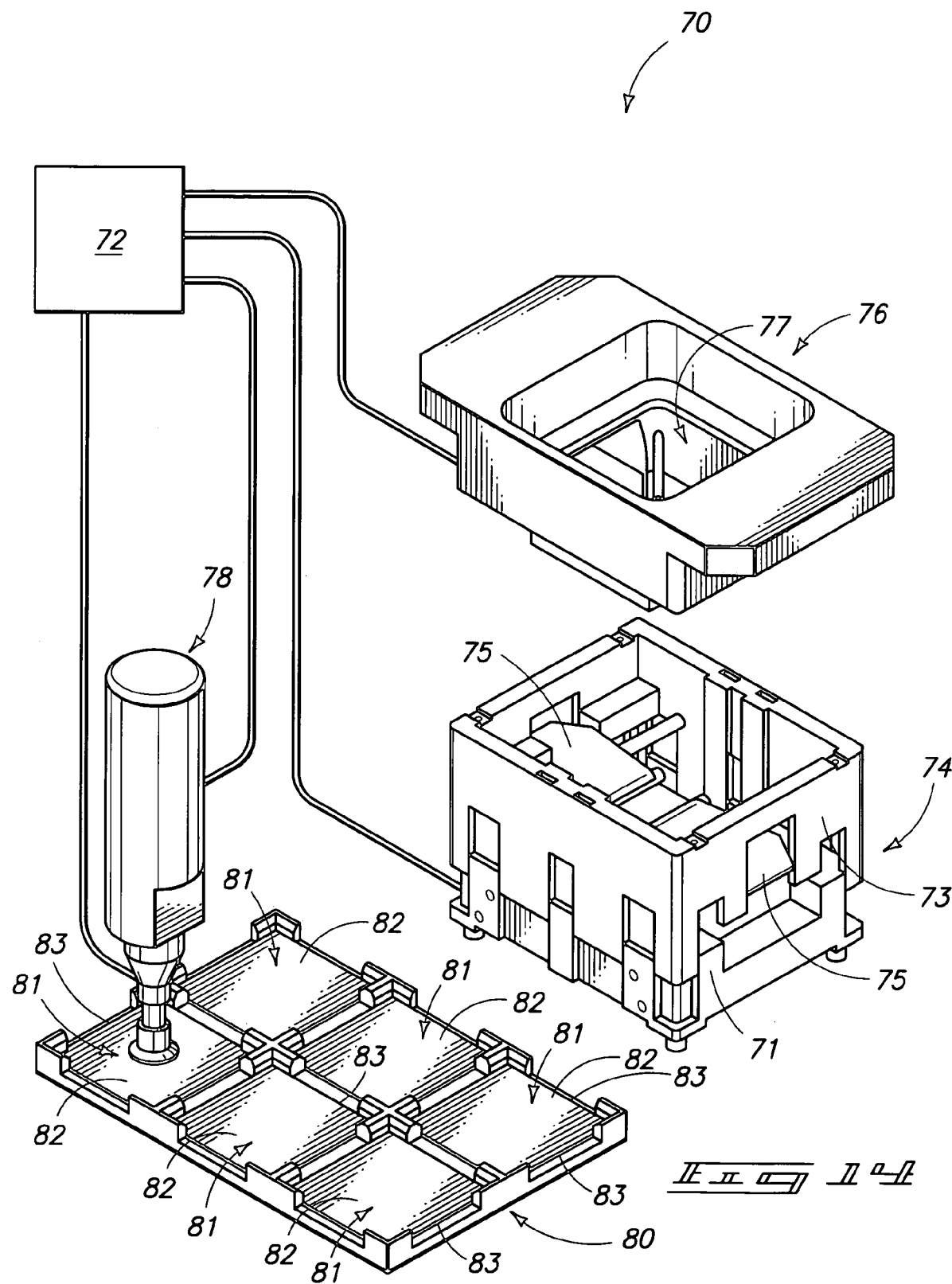
FIG. 14 illustrates the socket and assembly of FIG. 13 at a processing stage subsequent to that of FIG. 13.
Figure 15:
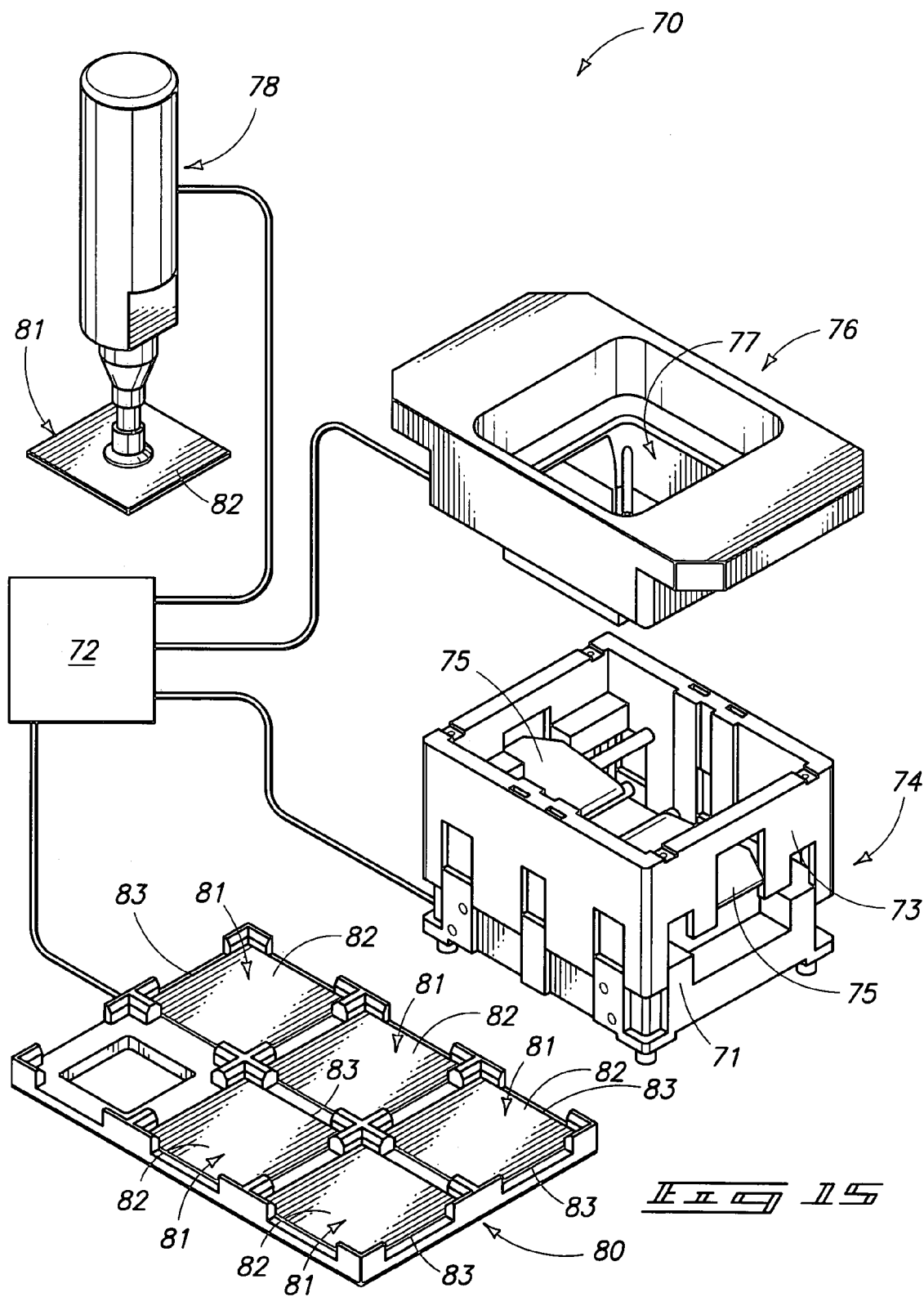
FIG. 15 illustrates the socket and assembly of FIG. 13 at a processing stage subsequent to that of FIG. 14.
Figure 16:
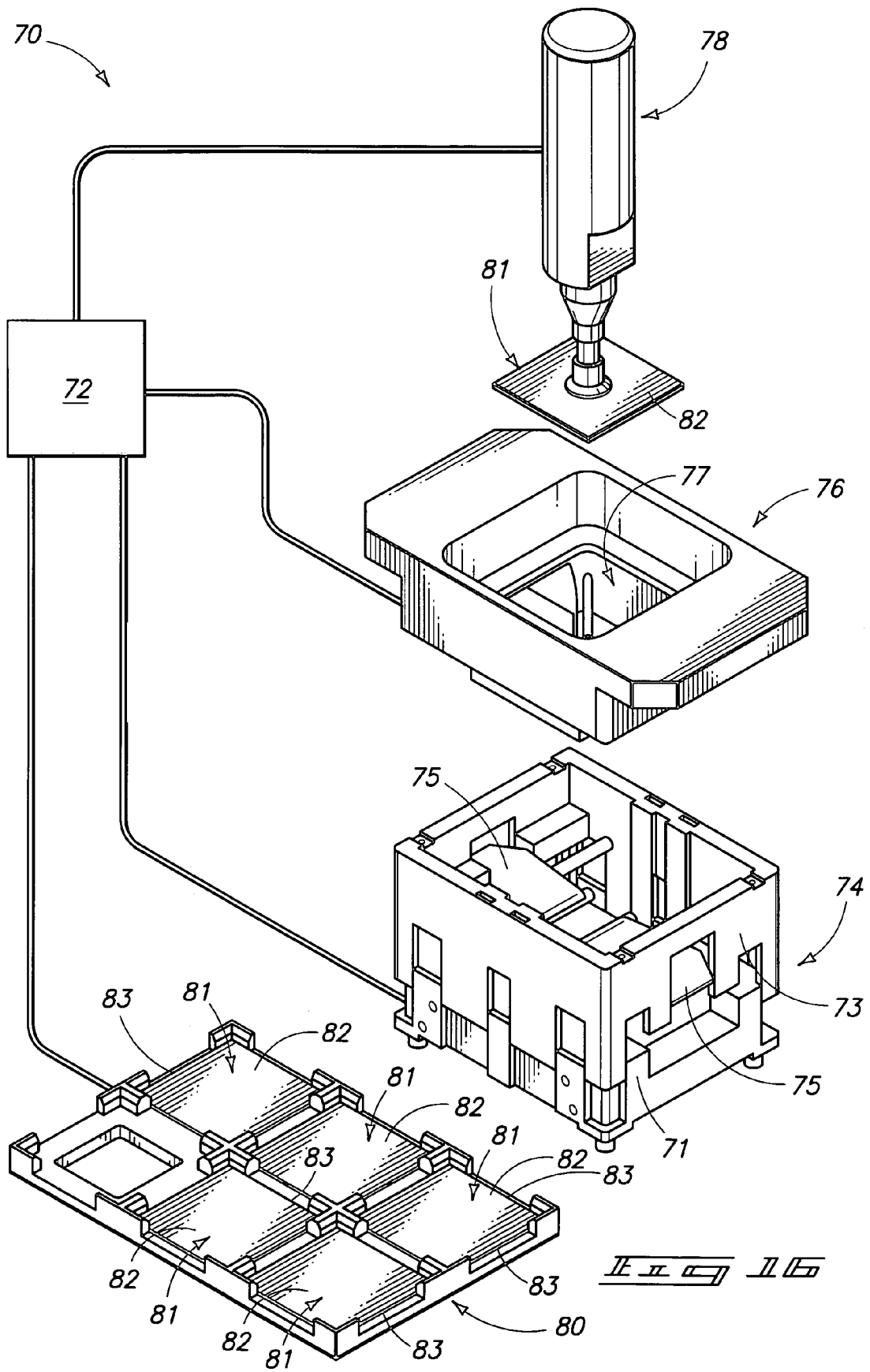
FIG. 16 illustrates the socket and assembly of FIG. 13 at a processing stage subsequent to that of FIG. 15.

Referring to FIGS. 14-16, manipulator 78 is utilized to pick a semiconductor component 82 from tray 80 and transfer the component to proximate nest 76.

Figure 17:
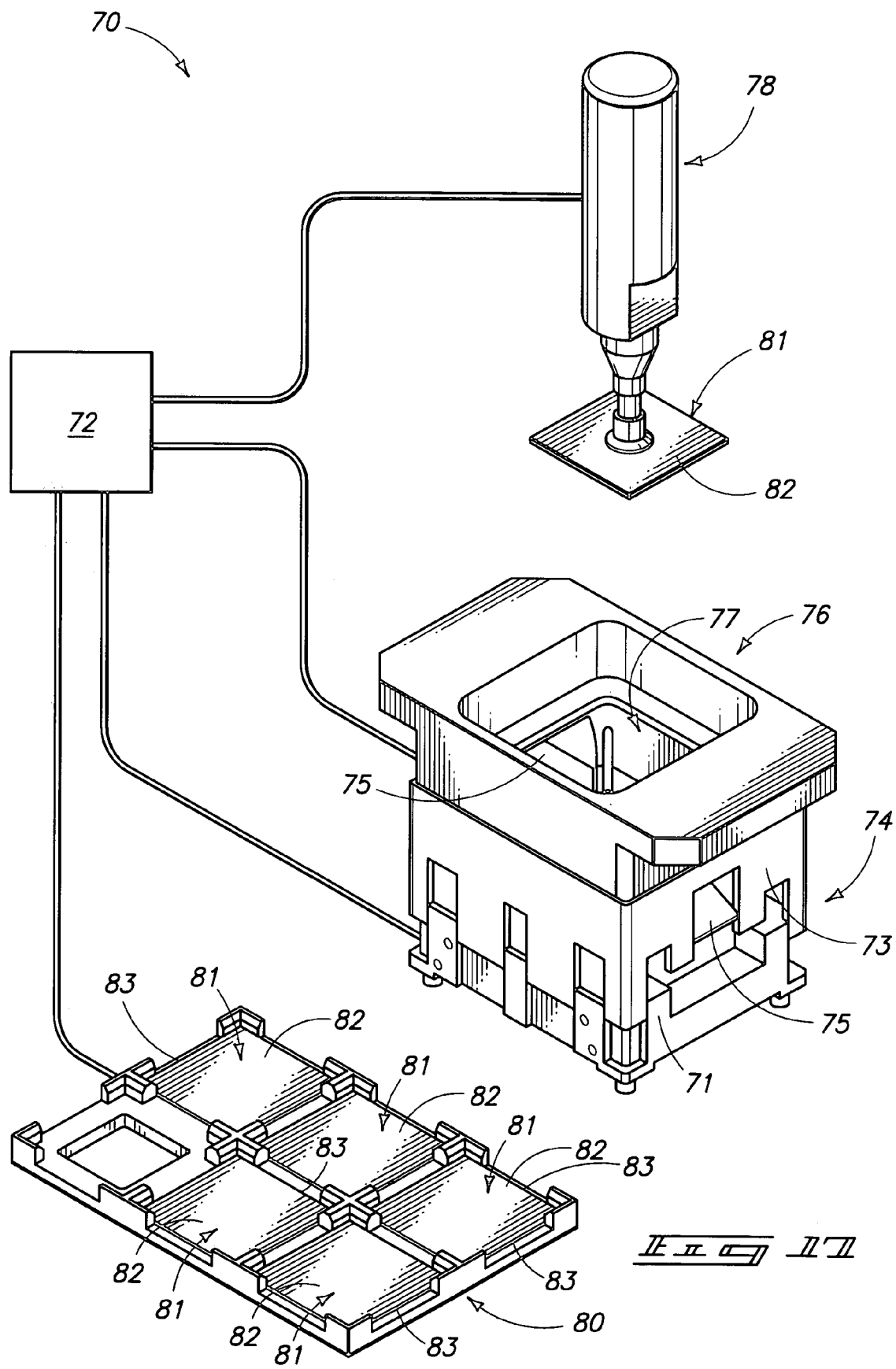
FIG. 17 illustrates the socket and assembly of FIG. 13 at a processing stage subsequent to that of FIG. 16.
Figure 18:
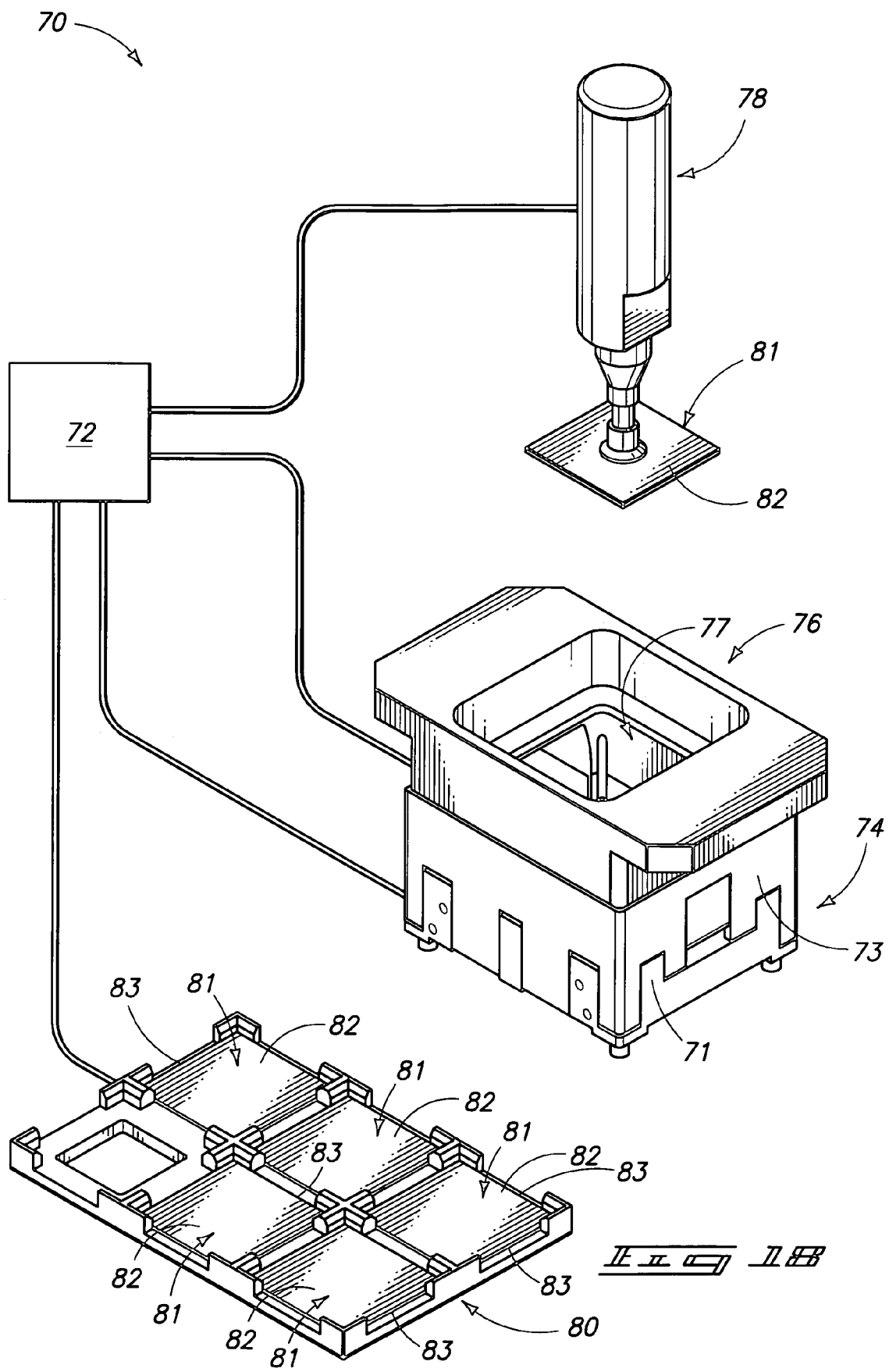
FIG. 18 illustrates the socket and assembly of FIG. 13 at a processing stage subsequent to that of FIG. 17.

Referring next to FIGS. 17 and 18, nest 76 is provided within lid 73 of socket 74 and then utilized to compress the lid toward the base 71. The compression can be accomplished by pressing nest 76 toward the base and/or pressing the base toward the nest. The compression of the lid toward the base shifts the clamps 75 of the retention mechanism into a loading position as discussed above with reference to prior art FIGS. 1-4.

Figure 19:
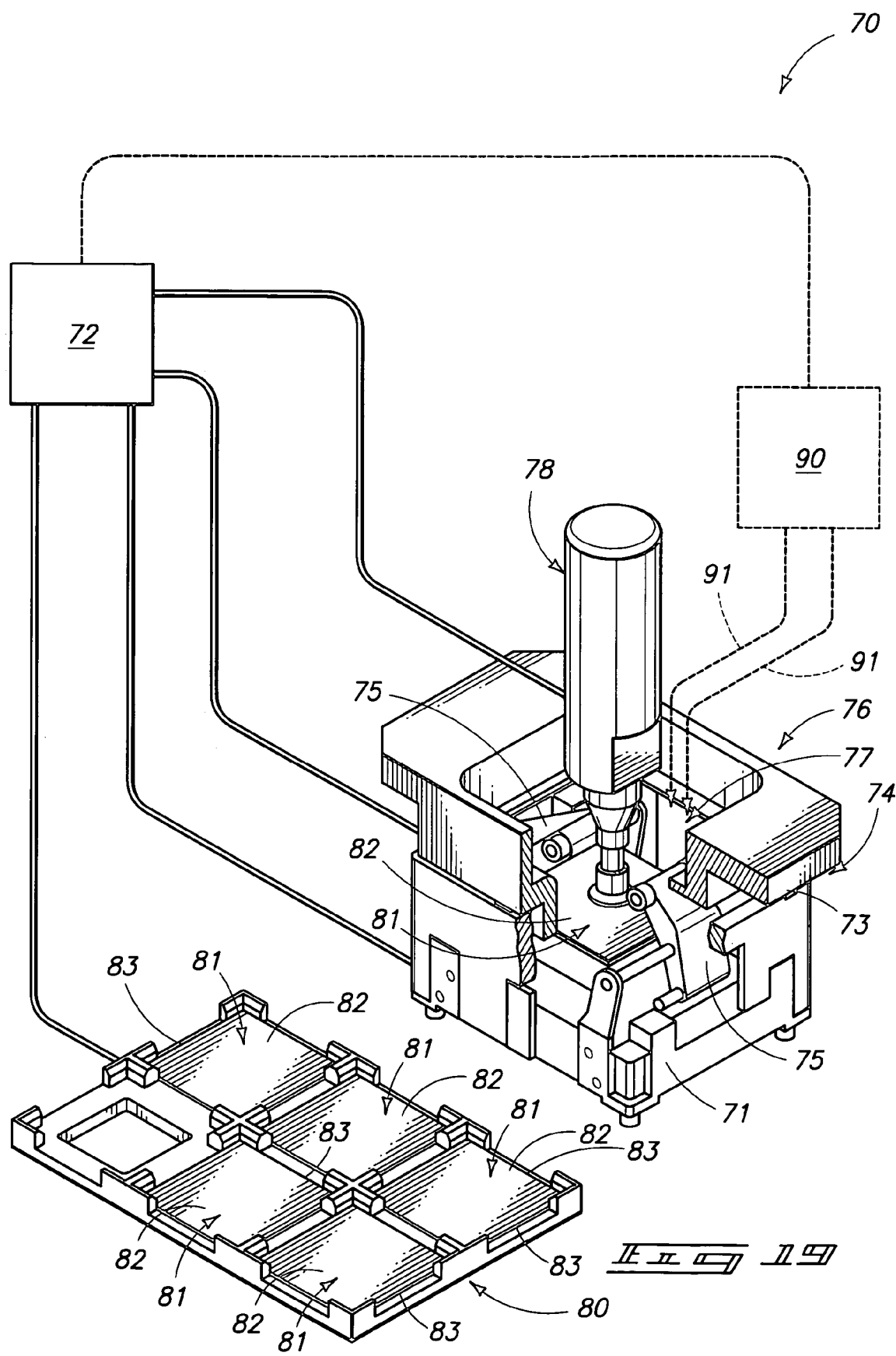
FIG. 19 illustrates the socket and assembly of FIG. 13 at a processing stage subsequent to that of FIG. 18. The socket and a removable nest of the assembly are shown in partial cut-away view in FIG. 19 to assist the reader in understanding the invention.

Referring to FIG. 19, manipulator 78 is utilized to move the semiconductor component 82 into the socket 74 while the alignment tool 76 compresses the lid 73 to keep the clamps 75 of the retention mechanism in the loading position. The alignment tool 76 and socket 74 are shown in partial cut-away view in FIG. 19 so that the clamps 75 can be seen to be in the loading position.

The alignment tool 76 is utilized for aligning the semiconductor component 82 within the socket (which can also be referred to as determining alignment of the component within the socket). Specifically, the inner periphery 77 of the alignment tool is configured to align the semiconductor component in a desired orientation within the socket. The inner periphery of the alignment tool can be configured to have tight tolerances to a desired alignment so that the alignment is accomplished entirely by mechanical alignment of the lateral periphery of the semiconductor component to the inner periphery of the alignment tool. In other aspects, the alignment tool can have looser tolerances and can be utilized to coarsely align the semiconductor component within the socket, and the fine alignment can be encompassed with another alignment tool. For instance, the fine alignment can be accomplished with an optical alignment tool which is coupled with controller 72 and utilized to orient the manipulator 78 within the socket.

An optical alignment tool 90 is shown in dashed-line view in FIG. 19 to indicate that the optical alignment tool can be utilized optionally in combination with the mechanical alignment tool 76. If an optical alignment tool is utilized, there can be some markings provided on the semiconductor component which can be optically located by the optical alignment tool, and/or the tool can be configured to recognize characteristics associated with the outline/profile of the component, and/or the tool can be configured to recognize characteristics associated with protruding features of some packages (e.g., the protruding balls of a BGA). The tool 90 is shown having radiation 91 projected therefrom, which is the electromagnetic radiation that the optical alignment tool utilizes for ascertaining alignment of the semiconductor component within the socket. Any suitable electromagnetic radiation can be utilized, including, but not limited to, light in the visible range.

In some aspects of the invention, the nest 76 is utilized only for compression of the lid, and all of the alignment of the semiconductor component within the socket is accomplished utilizing an optical alignment tool. The optical alignment tool can be of particular benefit when utilizing semiconductor components having lateral peripheries which are difficult to geometrically align, such as, for example, when utilizing circular semiconductor components or other shapes of semiconductor components having one or more axes of symmetry.

Figure 20:
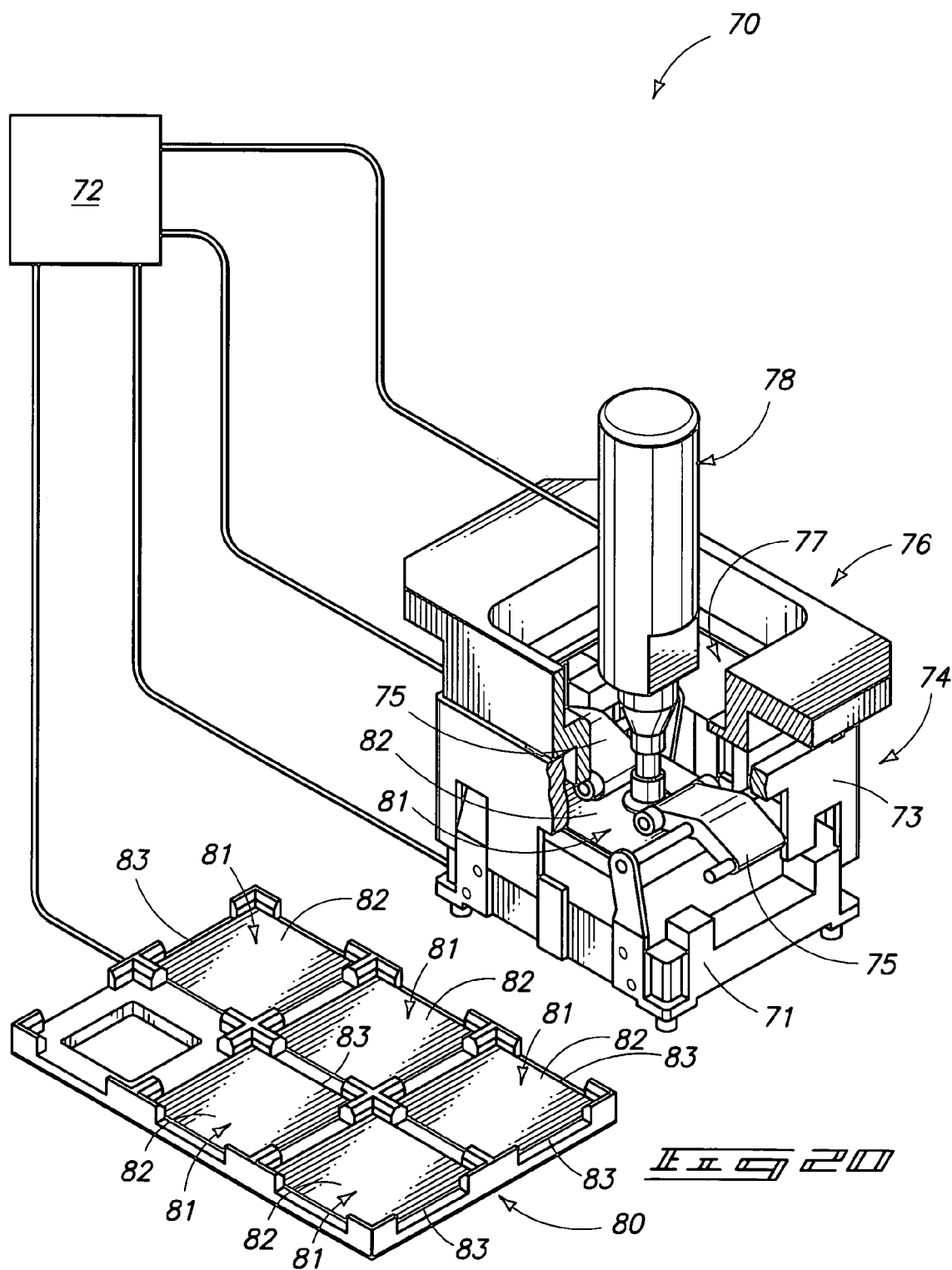
FIG. 20 illustrates the socket and assembly of FIG. 13 at a processing stage subsequent to that of FIG. 19. The socket and removable nest of the assembly are shown in partial cut-away view in FIG. 20 to assist the reader in understanding the invention.

Once the semiconductor component is appropriately aligned within the socket, the manipulator 78 is utilized to compress the component against the base of the socket to retain the component in a desired orientation. Subsequently, the nest 76 is withdrawn from within the socket which allows biasing mechanisms within the socket to push the lid 73 away from the base 71 and thereby begin shifting clamps 75 to a retaining position, as shown in FIG. 20. The alignment tool 76 and socket 74 are shown in partial cut-away view in FIG. 20 so that the clamps of the retention mechanism can be seen shifting to the retaining position.

The processing of FIGS. 19 and 20 is a significant departure from prior art processes for aligning components within sockets. Specifically, prior art processes would utilize a nest clipped within the socket to align a semiconductor component within the socket, and would utilize a device separate from the nest for compressing the socket and thereby shifting the retaining mechanism to the loading position. The prior art processes would further typically not use the manipulator to carry the component all the way to the base of the socket, but would rather place the retention mechanism in the loading position and then drop the semiconductor component from the manipulator while the component is in close proximity to a final seating location of the socket. The prior art processes would thus allow the component to seat itself within the socket under its own weight, while utilizing the interior periphery of the nest, and possibly guiding features associated with the terminal contacts of the semiconductor component (for instance, solder balls of a ball grid array) to align the semiconductor component. In contrast, the present invention maintains controlled placement of the semiconductor component within the socket by maintaining contact of the component to the manipulator until the retention mechanism is fully shifted to a retaining position; and thus until the retaining mechanism is tightly clamping the semiconductor component to the base of the socket.

Figure 21:
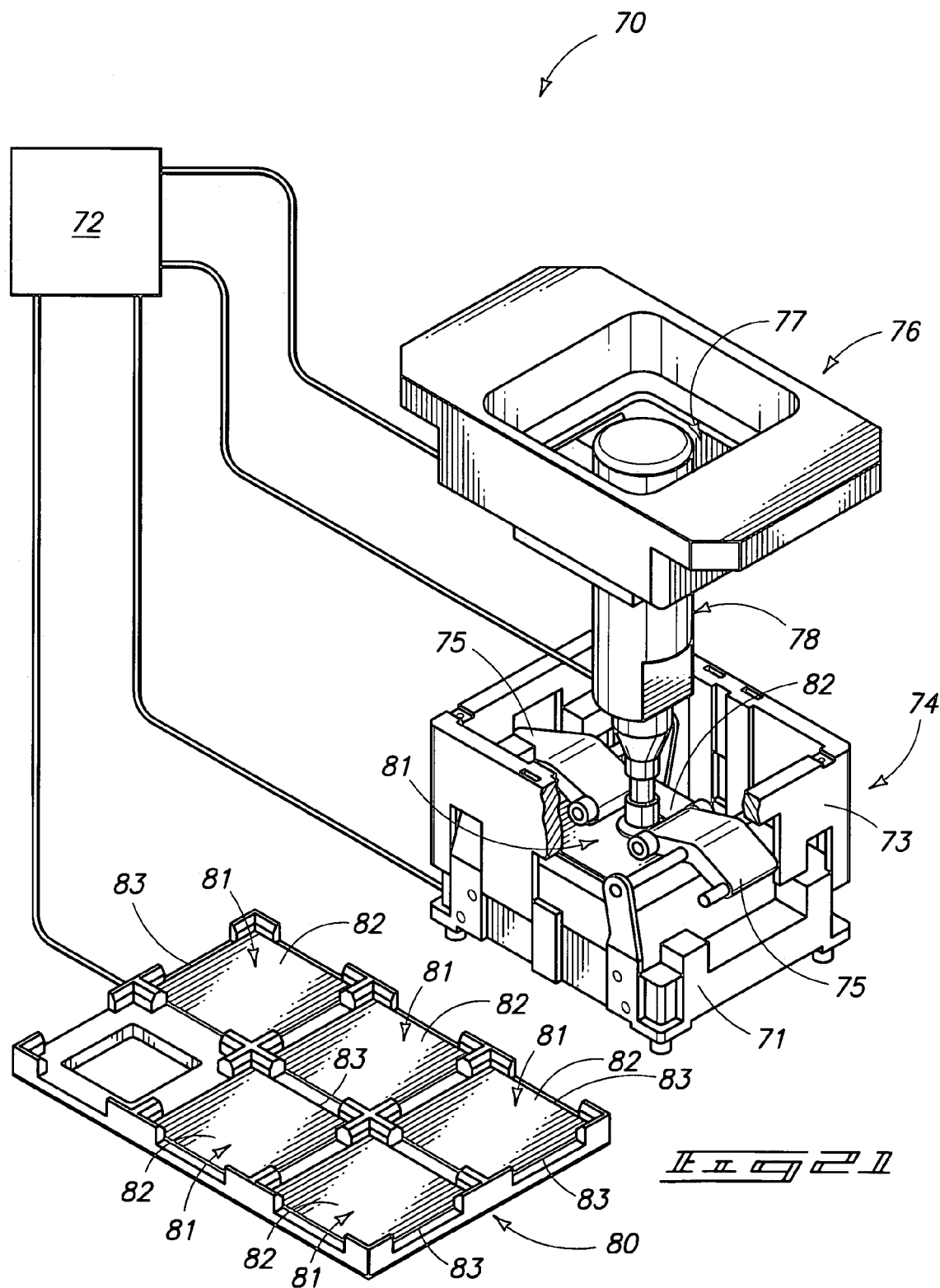
FIG. 21 illustrates the socket and assembly of FIG. 13 at a processing stage subsequent to that of FIG. 20. The socket is shown in partial cut-away view in FIG. 21 to assist the reader in understanding the invention.

Referring to FIG. 21, mechanical alignment tool 76 is further withdrawn from within socket 74, and manipulator 78 remains in contact with semiconductor component 82 to retain the component in a desired orientation until the clamps 75 of the retention mechanism have fully shifted to the retaining position. The socket is shown in partial cut-away view in FIG. 21 so that the clamps can be seen to be in the retaining position.

Figure 22:
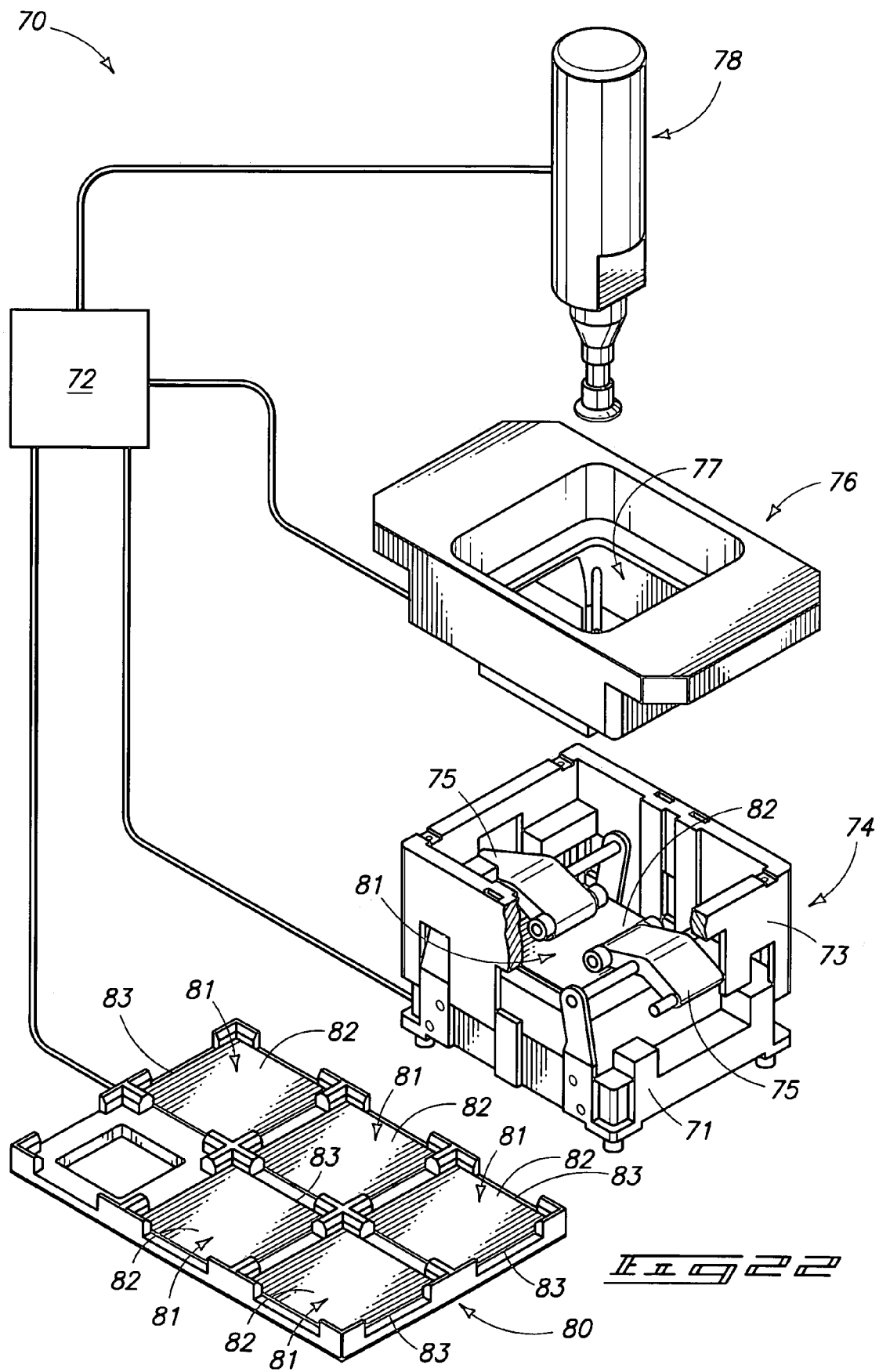
FIG. 22 illustrates the socket and assembly of FIG. 13 at a processing stage subsequent to that of FIG. 21. The socket is shown in partial cut-away view in FIG. 22 to assist the reader in understanding the invention.

Referring to FIG. 22, the component 82 within socket 74 is released from manipulator 78 after the clamps 75 of the retention mechanism are fully in the retaining position. The socket is shown in partial cut-away view in FIG. 22 so that the clamps can be seen to be in the retaining position.

The processing of FIGS. 13-22 can be repeated for multiple sockets by indexing a new socket into orientation to have a semiconductor component provided therein, and/or indexing any or all of the nest 76, manipulator 78, optical alignment device 90 and tray 80 to a new location to provide a semiconductor component within another socket. Various of the shown steps of FIGS. 13-22 can be changed in order in various aspects of the invention. For instance, the compression of the socket can be conducted prior to picking a component from the tray.

Although the processing of FIGS. 13-22 shows a single semiconductor component being transferred from the tray to a single socket with a single manipulator and single alignment tool; it is to be understood that the invention can also include aspects in which multiple manipulators are ganged together, and/or in which multiple alignment tools are ganged together, so that multiple semiconductor components can be transferred to multiple sockets in batch; and/or so that multiple components can be transferred to a single socket.

The exemplary processing of FIGS. 13-22 utilizes a socket having a retention mechanism of the type described relative to prior art FIGS. 1-8. Specifically, the retention mechanism comprises clamps configured to compress a semiconductor component against the base (or bottom) of a socket. Such methodology can be utilized with semiconductor components comprising terminal contacts arranged as a land grid array, ball grid array, or other configurations. It is to be understood, however, that aspects of the present invention can be utilized with numerous other socket retention mechanisms, including, for example, the retention mechanism described above with reference to prior art FIGS. 9-12. Thus, a semiconductor component utilized with methodology of the present invention can comprise a plurality of terminal contacts arranged in a ball grid array, and the socket utilized with methodology the present invention can include a retention mechanism which comprises clamps configured to grasp individual balls of the ball grid array. In some aspects, a semiconductor component can comprise a plurality of terminal contacts arranged in a ball grid array, and the socket can utilize a retention mechanism which comprises clamps to grasp individual balls of the ball grid array, and which also comprises clamps configured to compress the component against the base of the socket.

Although aspects of the invention can be utilized with semiconductor components having protruding terminal contacts (such as BGAs), the invention can be particularly useful when utilized with semiconductor components lacking protruding contacts (such as LGAs, LCCs, QFNs, and MLFs). When semiconductor components lack protruding terminal contacts, there is very little to use for fine alignment of the components within a socket except for peripheral features, and/or optical alignment features provided in addition to the peripheral features. The present invention can utilize mechanical precising tools and/or optical precising tools tailored to peripheral and/or optical alignment features of the semiconductor components, and yet only transiently associated with sockets during alignment of the components so that the sockets are not permanently modified to engage particular semiconductor components.

The aspect of the invention discussed with reference to FIGS. 13-22 provided a single semiconductor component within a socket. However, as indicated above, the invention can also include aspects in which multiple discrete semiconductor components are provided within a single socket. FIGS. 23-26 illustrate an exemplary aspect in which multiple semiconductor components are provided within a single socket.

Figure 23:
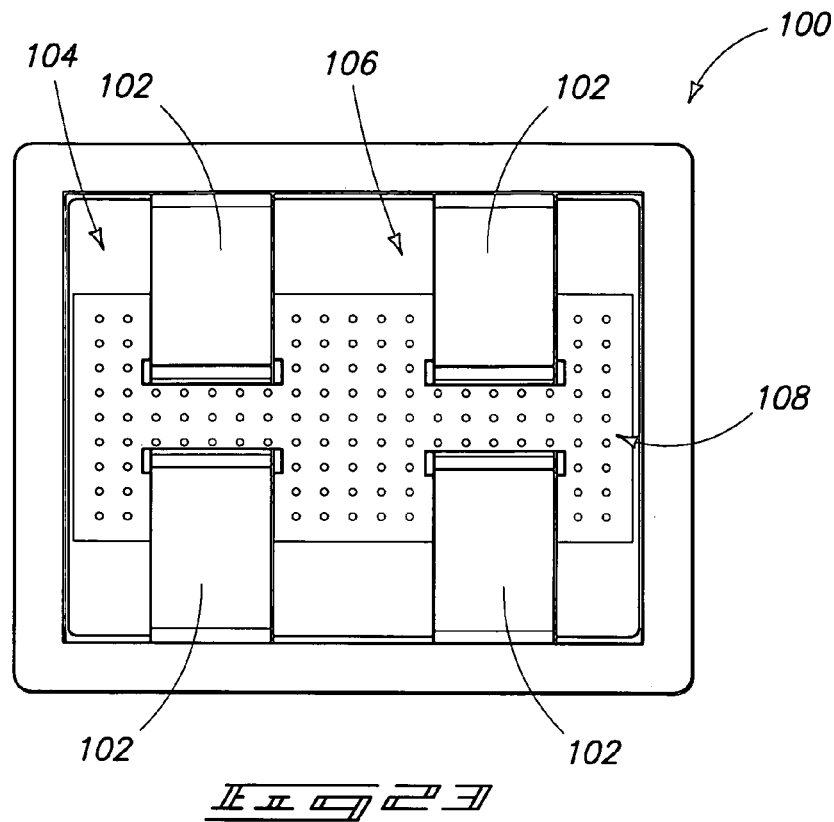
FIG. 23 is a diagrammatic top view of a socket at a preliminary processing stage in accordance with another aspect of the present invention.

Referring to FIG. 23, a socket 100 is illustrated in top view. The socket can be similar to the socket 74 discussed above with reference to FIGS. 13-22. However, the socket 100 comprises four clamps 102, in contrast to the socket 74 which comprises only two clamps 75. The four clamps 102 can be subdivided into two pairs which each correspond to separate retention mechanisms. For instance, the leftmost pair of clamps of FIG. 23 can be considered to correspond to a first retention mechanism 104, and the rightmost pair of clamps can be considered to correspond to a second retention mechanism 106. Both of the retention mechanisms are shown in a retaining position, and specifically the clamps are shown extending over a perforated region 108 of a base of the socket.

Figure 24:
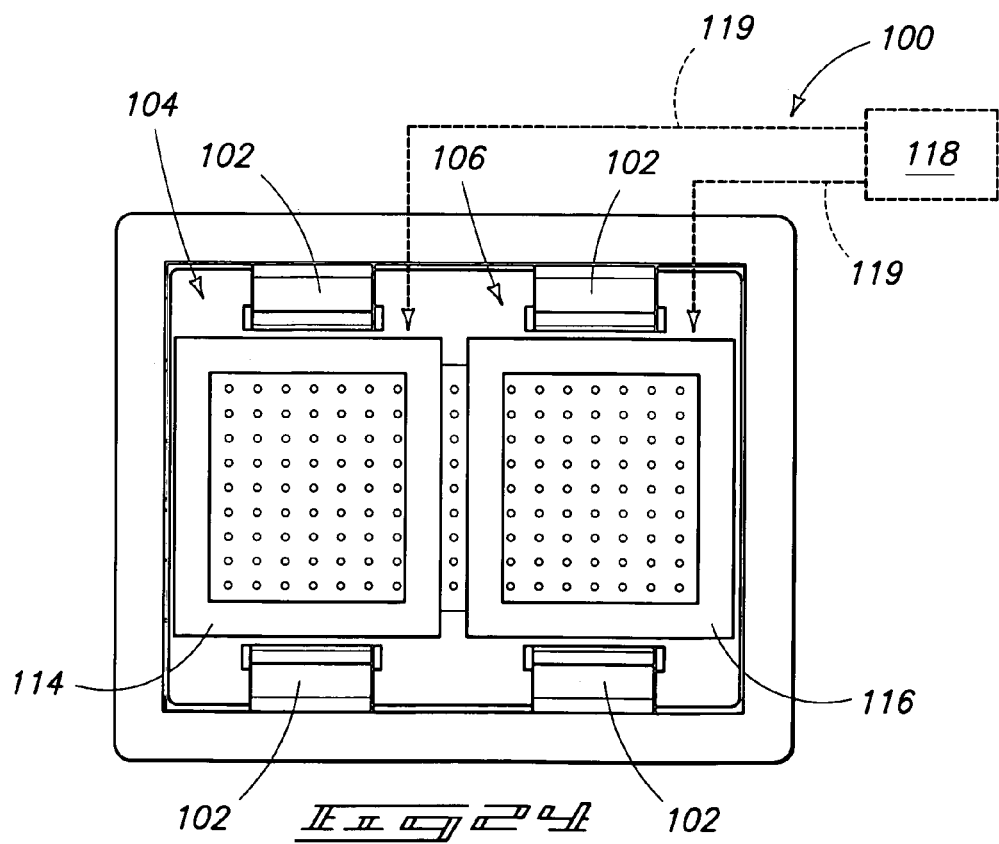
FIG. 24 is a diagrammatic top view of an assembly comprising the socket of FIG. 23 at a processing stage subsequent to that of FIG. 23.

Referring to FIG. 24, a pair of removable, mechanical alignment tools 114 and 116 are provided within socket 100 and utilized to compress a lid of the socket to shift retention mechanisms 104 and 106 into non-retaining positions. The mechanical alignment tools 114 and 116 can be referred to as a first alignment tool and a second alignment tool, respectively. The first and second alignment tools can be separate from one another, as shown, or can be together integrated into a one-piece tool.

FIG. 24 shows an optional optical alignment tool 118 which can be utilized in combination with the mechanical alignment tools 114 and 116 for aligning semiconductor components, analogously to the alignment discussed above with reference to FIG. 19. Dashed line arrows 119 extending from optical alignment tool 118 diagrammatically represent electromagnetic radiation projected from the tool and utilized for optical alignment of semiconductor components.

Figure 25:
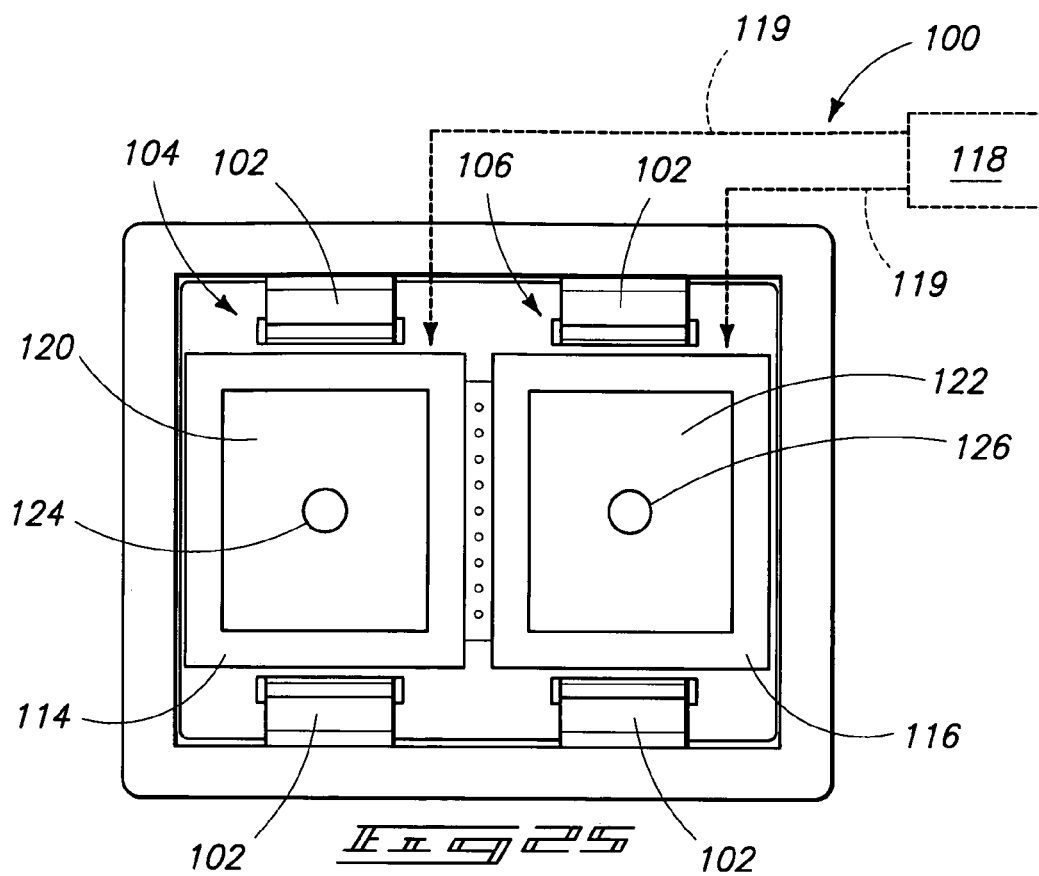
FIG. 25 is a diagrammatic top view of an assembly comprising the socket of FIG. 23 at a processing stage subsequent to that of FIG. 24.

Referring next to FIG. 25, semiconductor components 120 and 122 are placed within mechanical alignment tools 114 and 116, respectively; and are retained in position within the socket by manipulators 124 and 126, respectively. The manipulators can be referred to as a first manipulator 124 and a second manipulator 126, and can be analogous to the manipulator 78 discussed above with reference to FIGS. 13-22. Although the semiconductor components 121 and 122 are shown being identical to one another, it is to be understood that the components could differ from one another in geometrical configuration, and in such aspects the mechanical alignment tools 114 and 116 could also geometrically differ from one another, and further the retention mechanisms 104 and 106 could geometrically differ from one another. Also, although two manipulators are shown, it is to be understood that a single multi-pronged manipulator could be utilized to simultaneously place both of components 120 and 122 within the socket.

The optical alignment tool 118 and mechanical alignment tools 114 and 116 can be together utilized to align components 120 and 122 in desired orientations within socket 100.

Figure 26:
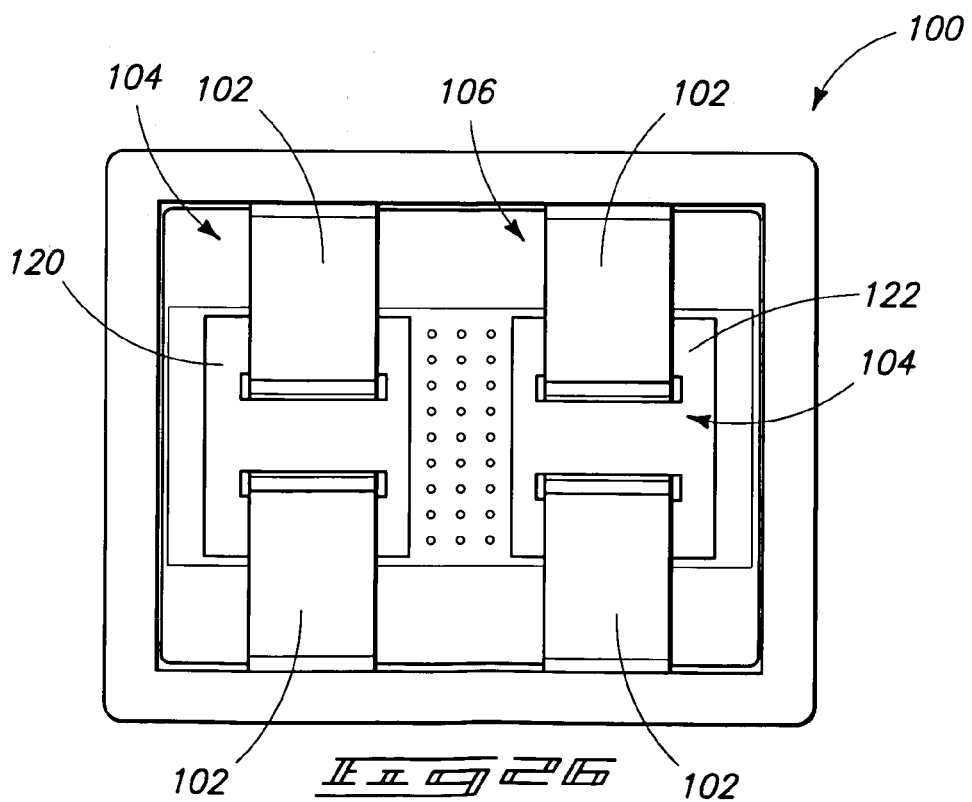
FIG. 26 is a diagrammatic top view of an assembly comprising the socket of FIG. 23 at a processing stage subsequent to that of FIG. 25.

Referring to FIG. 26, the mechanical alignment tools 114 and 116 are withdrawn from the socket, shifting retention mechanisms 104 and 106 into retaining positions; and subsequently manipulators 124 and 126 (FIG. 25) are detached from semiconductor components 120 and 122.

In some aspects, the present invention can be considered to comprise a system for utilizing two or more of multiple geometrically different semiconductor configurations within a plurality of identical sockets. For instance, the processing of FIGS. 13-22 utilizes a particular nest having an interior periphery configured to align the particular geometrical configuration of the shown semiconductor components. In further aspects, the same sockets as those of FIGS. 13-22 can be utilized with a second set of semiconductor components having a different geometrical configuration from that of the shown semiconductor components. Such can be accomplished by utilizing different nests having interior peripheries configured to align the particular geometrical configurations of the second set of semiconductor components. Since the alignment tools are only transitorily associated with the sockets as semiconductor components are placed within the sockets, (as shown above in FIGS. 17-21), the alignment tools can be reused and the sockets are never substantially modified or specialized until particular semiconductor components are retained in the sockets.

FIG. 27 shows the socket 74 of FIGS. 13-22 at a processing stage analogous to that of FIG. 15, but with an exemplary second type of semiconductor component 200 having a geometrical configuration much different than that of the components 82 of FIGS. 13-22, and utilized with a second alignment tool 202 for aligning the second component within the socket. Thus, the same socket 74 can be utilized with two different semiconductor component configurations by utilizing different alignment tools specialized for the semiconductor component configurations, and without modification of the socket. Although the mechanical alignment tool is shown modified, it is to be understood that an optical alignment tool can be modified additionally and/or alternatively to a mechanical alignment tool to adapt for utilizing different semiconductor component configurations.

The manipulator utilized for the second component 200 (FIG. 27) can be the same as that utilized for the first component 82 (FIG. 15), or different. Similarly, if an optical alignment tool is utilized, the optical alignment tool utilized for the second component 200 (FIG. 27) can be the same as that utilized for the first component 82 (FIG. 15), or different.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of providing a plurality of semiconductor components within a single socket, comprising:
    providing the socket; said socket comprising a base, a lid on the base, and at least two retention mechanisms associated with the base and configured to retain at least two separate semiconductor components; the lid being movable to shift the retention mechanisms between retaining positions and non-retaining positions;
    shifting the retention mechanisms to the non-retaining positions;
    while the retention mechanisms are in the non-retaining positions, placing at least two different semiconductor components within the socket with one or more manipulators; the semiconductor components being optically aligned as they are placed within the socket, the optical alignment comprising utilization of an optical alignment tool;
    after the semiconductor components are placed within the socket and aligned, shifting the retention mechanisms to the retaining positions to retain the semiconductor components within the socket;
    after the retention mechanisms are shifted to the retaining position, releasing the semiconductor components from the one or more manipulators;
    placing a plurality of mechanical alignment nests within the socket prior to shifting the retention mechanisms to the non-retaining positions; the mechanical alignment nests being in one-to-one correspondence with the semiconductor components, and the placement of the semiconductor components within the socket comprising placing the semiconductor components within the mechanical alignment nests; and removing the mechanical alignment nests from the socket after the semiconductor components are placed within the socket and aligned.

2. A method of providing a pair of semiconductor components within a single socket, comprising:
providing the socket; said socket comprising a base, a lid on the base, and a pair of retention mechanisms associated with the base and configured to retain the pair of separate semiconductor components; the lid being movable to shift the retention mechanisms between retaining positions and non-retaining positions; the retention mechanisms being a first retention mechanism and a second retention mechanism; the semiconductor substrates of said pair of semiconductor substrates being a first semiconductor substrate and a second semiconductor substrate;
placing a pair of mechanical alignment nests within the socket and utilizing the nests to press the lid and thereby shift the retention mechanisms from the retaining positions to the non-retaining positions; the mechanical alignment nests being a first mechanical alignment nest and a second mechanical alignment nest;
while the retention mechanisms are in the non-retaining positions, placing the first and second semiconductor components within the first and second mechanical alignment nests, respectively, with one or more manipulators; the semiconductor components being optically aligned as they are placed within the mechanical alignment nests, the optical alignment comprising utilization of an optical alignment tool;
after the semiconductor components are placed within the socket and aligned, shifting the retention mechanisms to the retaining positions to retain the semiconductor components within the socket; and
after the retention mechanisms are shifted to the retaining positions, releasing the semiconductor components from the one or more manipulators.

3. The method of claim 2 wherein the first and second mechanical alignment nests are different in geometrical configuration from one another.

4. The method of claim 2 wherein the first and second mechanical alignment nests are a same size and shape as one another.

5. The method of claim 2 wherein the first and second semiconductor components are a same size and shape as one another.

6. A method of providing a pair of semiconductor components within a single socket, comprising:
providing the socket to comprise a base, a lid on the base, and a pair of retention mechanisms associated with the base and configured to retain the pair of separate semiconductor components; the lid being movable to shift the retention mechanisms between retaining positions and non-retaining positions; the retention mechanisms being a first retention mechanism and a second retention mechanism; the first and second retention mechanisms each comprising a pair of retractable clamps configured to extend across a semiconductor substrate and press the substrate against a base; the retractable clamps of the first retention mechanisms retracting along a first axis, and the retractable clamps of the second retention mechanism retracting along a second axis that is parallel to the first axis; the semiconductor substrates of said pair of semiconductor substrates being a first semiconductor substrate and a second semiconductor substrate;
placing a pair of mechanical alignment nests within the socket and utilizing the nests to press the lid and thereby shift the retention mechanisms from the retaining positions to the non-retaining positions; the mechanical alignment nests being a first mechanical alignment nest and a second mechanical alignment nest; the first and second mechanical nests being spaced from one another within the socket by a gap that extends between the first and second mechanical nests;
while the retention mechanisms are in the non-retaining positions, placing the first and second semiconductor components within the first and second mechanical alignment nests, respectively, with one or more manipulators; the semiconductor components being optically aligned as they are placed within the mechanical alignment nests, the optical alignment comprising utilization of an optical alignment tool;
after the semiconductor components are placed within the socket and aligned, shifting the retention mechanisms to the retaining positions to retain the semiconductor components within the socket; and
after the retention mechanisms are shifted to the retaining positions, releasing the semiconductor components from the one or more manipulators.

7. The method of claim 6 wherein the first and second mechanical alignment nests are different in geometrical configuration from one another.

8. The method of claim 6 wherein the first and second mechanical alignment nests are a same size and shape as one another.

9. The method of claim 6 wherein the first and second semiconductor components are a same size and shape as one another.

* * * * *